US012795886B2

(12) United States Patent
Liu et al.

(10) Patent No.: US 12,795,886 B2
(45) Date of Patent: Nov. 10, 2026

(54) SEMICONDUCTOR DEVICE AND FABRICATION METHOD THEREOF

(71) Applicant: YANGTZE MEMORY TECHNOLOGIES CO., LTD., Wuhan (CN)

(72) Inventors: Zichen Liu, Wuhan (CN); Wei Liu, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 303 days.

(21) Appl. No.: 18/542,228

(22) Filed: Dec. 15, 2023

(65) Prior Publication Data

US 2025/0113481 A1 Apr. 3, 2025

Related U.S. Application Data

(63) Continuation of application No. PCT/CN2023/122906, filed on Sep. 28, 2023.

(51) Int. Cl.

*H01L 21/68* (2006.01)
*H10B 12/00* (2023.01)

(52) U.S. Cl.

CPC ......... *H10B 12/05* (2023.02); *H10B 12/0335* (2023.02); *H10B 12/315* (2023.02)

(58) Field of Classification Search

CPC .. H10B 12/05; H10B 12/0335; H10B 12/315; H10B 12/053; H10D 30/63
USPC .......................................................... 257/296
See application file for complete search history.

(56) References Cited

U.S. PATENT DOCUMENTS 6,391,705 B1 * 5/2002 Hsiao ................. H10B 12/0383 438/246
6,552,382 B1 * 4/2003 Wu ...................... H10B 12/395 257/305
6,700,150 B1 * 3/2004 Wu .................... H10B 12/0383 438/242

(Continued)

FOREIGN PATENT DOCUMENTS

CN 114023743 A 2/2022
CN 114792685 A 7/2022

(Continued)

OTHER PUBLICATIONS

Extended European Search Report issued in corresponding European Application No. 23953766.5, mailed on Aug. 8, 2026, 10 pages.

*Primary Examiner* — Vu A Vu
(74) *Attorney, Agent, or Firm* — BAYES PLLC

(57) ABSTRACT

The present disclosure discloses a semiconductor device and a fabrication method thereof. The semiconductor device includes a plurality of first gate structures and second gate structures extending in a first direction and arranged alternatively in a second direction. The first gate structure includes a first isolation structure. The second gate structure includes a second isolation structure. The first isolation structure and the second isolation structure adjacent to each other in the second direction are disposed oppositely, and the first isolation structure and the second isolation structure are both located on one end in the first direction. The present disclosure may improve the yield and the reliability.

20 Claims, 27 Drawing Sheets

(56) References Cited

U.S. PATENT DOCUMENTS

| | | | | |
|---|---|---|---|---|
| 6,727,539 | B2 * | 4/2004 | Divakaruni | H10B 12/488<br>257/E21.655 |
| 6,734,485 | B2 * | 5/2004 | Wu | H10D 1/047<br>257/302 |
| 7,459,741 | B2 * | 12/2008 | Kidoh | H10B 12/395<br>257/314 |
| 8,173,506 | B2 * | 5/2012 | Jung | H10D 64/0131<br>438/270 |
| 9,166,034 | B2 * | 10/2015 | Nam | H10D 64/513 |
| 11,770,925 | B2 * | 9/2023 | Kim | H10B 12/0335<br>257/296 |
| 12,408,324 | B2 * | 9/2025 | Lee | H10B 12/315 |
| 2023/0170416 | A1 | 6/2023 | Xiao et al. | |
| 2023/0247819 | A1 | 8/2023 | Sun et al. | |
| 2023/0261112 | A1 | 8/2023 | Yang et al. | |

FOREIGN PATENT DOCUMENTS

| | | | |
|---|---|---|---|
| CN | 116507119 | A | 7/2023 |
| TW | 201801186 | A | 1/2018 |
| TW | 201906144 | A | 2/2019 |
| TW | 202034527 | A | 9/2020 |
| WO | 2023130655 | A1 | 7/2023 |

* cited by examiner

100

SEMICONDUCTOR DEVICE AND FABRICATION METHOD THEREOF

CROSS-REFERENCE TO RELATED APPLICATIONS

This application is a continuation of International Application No. PCT/CN2023/122906, filed on Sep. 28, 2023, which is incorporated herein by reference in its entirety.

TECHNICAL FIELD

The present disclosure relates to the semiconductor technology field, and in particular to a semiconductor device and a fabrication method thereof.

BACKGROUND

As the feature sizes of memory cells approach a lower limit of a process, planar process and manufacturing techniques have become challenging and expensive, resulting in a two-dimensional (2D) memory with storage density approaching an upper limit.

In order to overcome limitations on the 2D memory, a memory with a three-dimensional (3D) structure have been developed in the industry to improve the storage density.

However, as the integration level of the memory increases, how to well arrange various gates to reduce interference among gates is still a problem to be addressed at present.

SUMMARY

According to one aspect of the present disclosure, a method of fabricating a semiconductor device is provided. The method may include providing a substrate. The method may include forming a plurality of first gate trenches and a plurality of second gate trenches extending in a first direction in the substrate. The plurality of first gate trenches and the plurality of second gate trenches may be arranged alternatively in a second direction intersecting the first direction. The method may include forming first gate structures in the first gate trenches such that each of the first gate structures includes a first gate line, a second gate line, and a first isolation structure located between the first gate line and the second gate line. The method may include forming second gate structures in the second gate trenches such that each of the second gate structures comprises a third gate line, a fourth gate line, and a second isolation structure located between the third gate line and the fourth gate line. The first isolation structure and the second isolation structure adjacent to each other in the second direction may be disposed oppositely, and may be both located on a same side in the first direction.

In some implementations, the method may further include forming the first gate structure to further comprise a third isolation structure located between the first gate line and the second gate line and on the other side in the first direction. In some implementations, the method may further include forming the second gate structure to further include a fourth isolation structure located between the third gate line and the fourth gate line and on the other side in the first direction. In some implementations, the third isolation structure and the fourth isolation structure adjacent to each other in the second direction may be disposed oppositely.

In some implementations, the method may further include disposing the first isolation structure and the third isolation structure of a same first gate structure on different sides in the second direction. In some implementations, the method may further include disposing the second isolation structure and the fourth isolation structure of a same second gate structure on different sides in the second direction.

In some implementations, the forming the first gate structure further may include forming a first oxide layer on an inner wall of the first gate trench. In some implementations, the forming the first gate structure further may include forming a first conductive layer on an inner wall of the first oxide layer. In some implementations, the forming the first gate structure further may include forming a first spacer structure in the first conductive layer. In some implementations, the forming the first gate structure further may include forming the first isolation structure on a first side of a first end of the first conductive layer and forming the third isolation structure on a second side of a second end of the first conductive layer, so that the first conductive layer is separated into the first gate line and the second gate line. In some implementations, the first end and the second end may be two opposite ends of the first conductive layer in the first direction, and the first side and the second side may be two opposite sides of the first conductive layer in the second direction.

In some implementations, the method may further include forming a plurality of shielding trenches extending in the first direction in the substrate, each of which is located between the first gate trench and the second gate trench adjacent to each other in the second direction. In some implementations, the method may further include forming shielding structures in the shielding trenches.

In some implementations, the method may further include forming a first gate line leading-out structure and a second gate line leading-out structure, connecting the first gate line leading-out structure with the first gate line at a first end of the first gate structure in the first direction, and connecting the second gate line leading-out structure with the second gate line at a second end of the first gate structure in the first direction. In some implementations, the method may further include forming a third gate line leading-out structure and a fourth gate line leading-out structure, connecting the third gate line leading-out structure with the third gate line at a first end of the second gate structure in the first direction, and connecting the fourth gate line leading-out structure with the fourth gate line at a second end of the second gate structure in the first direction. In some implementations, the method may further include forming a shield leading-out structure and connecting the shield leading-out structure with an end of the shielding structure in the first direction.

In some implementations, the plurality of shielding structures may be odd-numbered rows of shielding structures and even-numbered rows of shielding structures arranged alternatively in the second direction. In some implementations, the forming the shield leading-out structures may further include connecting the shield leading-out structures with first ends of the odd-numbered rows of shielding structures and second ends of the even-numbered rows of shielding structures respectively. In some implementations, the first end and the second end may be two opposite ends of an individual shielding structure in the first direction.

In some implementations, the forming the shield leading-out structures may further include forming the shield leading-out structure between the first isolation structure and the second isolation structure adjacent to each other or between the third isolation structure and the fourth isolation structure adjacent to each other.

In some implementations, the method may further include forming separating structures extending in the second direction and arranged with intervals in the first direction in the substrate such that a semiconductor pillar array is formed in the substrate after forming the first gate trenches and the second gate trenches. In some implementations, the semiconductor pillar array may include semiconductor pillars extending in a third direction intersecting the first direction and the second direction. In some implementations, the method may further include forming a capacitive structure located on a side of the semiconductor pillar in the third direction and connecting the capacitive structure with the semiconductor pillar and a common end. In some implementations, the capacitive structure may extend in the third direction. In some implementations, the method may further include forming a bit line located on the other side of the semiconductor pillar in the third direction. In some implementations, the bit line may extend in the first direction, and may be connected with the semiconductor pillar.

In some implementations, the method may further include forming the first gate line leading-out structure and the second gate line leading-out structure at an end of the first gate structure away from the capacitive structure in the third direction respectively, and forming the third gate line leading-out structure and the fourth gate line leading-out structure at an end of the second gate structure away from the capacitive structure in the third direction respectively. IN some implementations, the method may further include forming the shield leading-out structure at an end of the shielding structure away from the capacitive structure in the third direction, or forming the shield leading-out structure at an end of the shielding structure close to the capacitive structure in the third direction.

According to another aspect of the present disclosure, a semiconductor device is provided. The semiconductor device may include a transistor array including a plurality of first gate structures and a plurality of second gate structures extending in a first direction and arranged alternatively in a second direction intersecting the first direction. Each of the first gate structures may include a first gate line, a second gate line, and a first isolation structure located between the first gate line and the second gate line. Each of the second gate structures may include a third gate line, a fourth gate line, and a second isolation structure located between the third gate line and the fourth gate line. The first isolation structure and the second isolation structure adjacent to each other in the second direction may be disposed oppositely, and may both be located on a same side in the first direction.

In some implementations, the first gate structure further may include a third isolation structure located between the first gate line and the second gate line and on the other side in the first direction. In some implementations, the second gate structure may further include a fourth isolation structure located between the third gate line and the fourth gate line and on the other side in the first direction. In some implementations, the third isolation structure and the fourth isolation structure adjacent to each other in the second direction may be disposed oppositely.

In some implementations, the first isolation structure and the third isolation structure of a same first gate structure may be located on different sides in the second direction, and the second isolation structure and the fourth isolation structure of a same second gate structure may be located on different sides in the second direction.

In some implementations, the first gate structure may further include a first spacer structure located between the first gate line and the second gate line and extending in the first direction; and a first oxide layer on outer sides of the first gate line and the second gate line, which are away from each other. In some implementations, the second gate structure may further include a second spacer structure located between the third gate line and the fourth gate line and extending in the first direction. In some implementations, the second gate structure may further include a second oxide layer on outer sides of the third gate line and the fourth gate line, which are away from each other.

In some implementations, the semiconductor device may further include a plurality of shielding structures each extending in the first direction and located between the first gate structure and the second gate structure adjacent to each other in the second direction.

According to a further aspect of the present disclosure, a semiconductor device is provided. The semiconductor device may include a transistor array including a plurality of first gate structures and a plurality of second gate structures extending in a first direction and arranged alternatively in a second direction intersecting the first direction. Each of the first gate structures may include a first gate line, a second gate line, and a first isolation structure located between the first gate line and the second gate line. Each of the second gate structures may include a third gate line, a fourth gate line, and a second isolation structure located between the third gate line and the fourth gate line. The semiconductor device may include a first gate line leading-out structure at a first end of the first gate structure in the first direction and connected with the first gate line, and a second gate line leading-out structure at a second end of the first gate structure in the first direction and connected with the second gate line. The semiconductor device may include a third gate line leading-out structure at a first end of the second gate structure in the first direction and connected with the third gate line, and a fourth gate line leading-out structure at a second end of the second gate structure in the first direction and connected with the fourth gate line. The first isolation structure and the second isolation structure adjacent to each other in the second direction may be disposed oppositely, and may be both located on a same side in the first direction.

In some implementations, the semiconductor device may further include a plurality of shielding structures each extending in the first direction and located between the first gate structure and the second gate structure adjacent to each other in the second direction. In some implementations, the semiconductor device may further include a plurality of shield leading-out structures each connected with an end of the shielding structure in the first direction.

In some implementations, the plurality of shielding structures may include odd-numbered rows of shielding structures and even-numbered rows of shielding structures arranged alternatively in the second direction, and the plurality of shield leading-out structures may be connected with first ends of the odd-numbered rows of shielding structures and second ends of the even-numbered rows of shielding structures respectively. In some implementations, the first end and the second end may be two opposite ends of an individual shielding structure in the first direction.

In some implementations, in the shield leading-out structure may be located between the first isolation structure and the second isolation structure adjacent to each other or between the third isolation structure and a fourth isolation structure adjacent to each other.

In some implementations, the semiconductor device may further include a semiconductor pillar array including a plurality of semiconductor pillars arranged in an array along the first direction and the second direction and extending in a third direction intersecting the first direction and the second direction. In some implementations, each semiconductor pillar may be located between the shielding structure and the first gate structure or the second gate structure adjacent to each other. In some implementations, the semiconductor device may further include a capacitive structure located on a side of the semiconductor pillar in the third direction and connected with the semiconductor pillar and a common end, wherein the capacitive structure extends in the third direction. In some implementations, the semiconductor device may further include a bit line located on the other side of the semiconductor pillar in the third direction and extending in the first direction and connected with the semiconductor pillar. In some implementations, the first gate line leading-out structure and the second gate line leading-out structure may be located at an end of the first gate structure away from the capacitive structure in the third direction. In some implementations, the third gate line leading-out structure and the fourth gate line leading-out structure may be located at an end of the second gate structure away from the capacitive structure in the third direction. In some implementations, the shield leading-out structure may be located at an end of the shielding structure away from the capacitive structure in the third direction, or the shield leading-out structure may be located at an end of the shielding structure close to the capacitive structure in the third direction.

BRIEF DESCRIPTION OF DRAWINGS

In order to explain the technical solutions in implementations of the present disclosure more clearly, accompanying drawings required in describing implementations will be described in brief below. It is obvious that the below described drawings are only some implementations of the present disclosure and other drawings may be obtained according to these drawings without any creative work.

DETAILED DESCRIPTION

Figure 1:
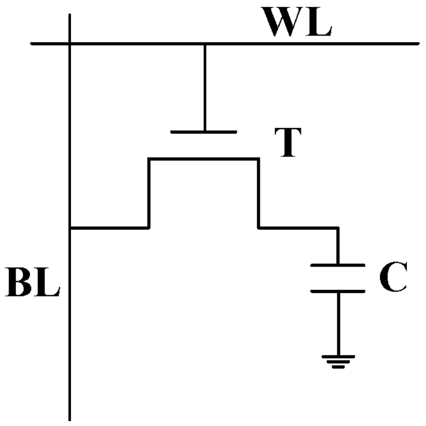
FIG. 1 is a circuit diagram of a memory cell of a semiconductor device as provided in an implementation of the present disclosure.

The technical solutions in implementations of the present disclosure will be described below clearly and completely with reference to accompanying drawings in implementations of the present disclosure. However, it is obvious that the described implementations are only a part, but not all of implementations of the present disclosure. All other implementations obtained based on the implementations of the present disclosure by those skilled in the art without any creative work fall within the scope of the present disclosure. Furthermore, it will be understood that implementations as described herein are merely used for illustrating and explaining the present disclosure rather than limiting the present disclosure. In the present disclosure, unless otherwise stated, orientation terms as used such as "upper" and "lower" typically refer to the upper and lower parts of a device in practical use or operation state which are specifically the drawing direction in the figures; whereas "inner" and "outer" are used with respect to the profile of a device.

A transistor may be used in a dynamic random access memory (DRAM) to control capacitance of each memory cell. The basic memory cell structure of the dynamic random access memory consists of a transistor and a capacitor structure, and its primary principle is to represent a binary bit as 1 or 0 by the amount of charges stored in the capacitor.

With the development of dynamic random access memory technology, the size of a memory cell is becoming smaller and smaller with the array architecture from $8F^2$ to $6F^2$ and further to $4F^2$. Additionally, based on the demand for ions and leak current in the dynamic random access memory, the memory architecture has developed from a planar array transistor to a recess gate array transistor, then to a buried saddle fin array transistor, and to a vertical gate transistor.

In practical applications, regardless of the planar transistor, recess gate array transistor, buried transistor or vertical gate transistor, a dynamic random access memory consists of a plurality of memory cell structures each primarily consisting of a transistor and a capacitive structure operated and controlled by the transistor. That is, a dynamic random access memory includes 1 transistor and 1 capacitor, namely a 1T1C architecture, and its primary principle is to represent a binary bit as 1 or 0 by the amount of charges stored in the capacitor.

FIG. 1 is a circuit diagram of an architecture with 1T1C as provided in an implementation of the present disclosure. As shown in FIG. 1, the drain of the transistor T is electrically connected with a bit line BL, the source of the transistor T is electrically connected with one of the electrode plates of the capacitor C, another electrode plate of the capacitor C is grounded via a ground terminal (GND), and the gate of the transistor T is connected with a word line WL. A voltage is applied via the word line WL to control the transistor T to be turned on or off, and the bit line BL is configured to perform reading or writing operation on the capacitor C while the transistor T is turned on.

Figure 2:
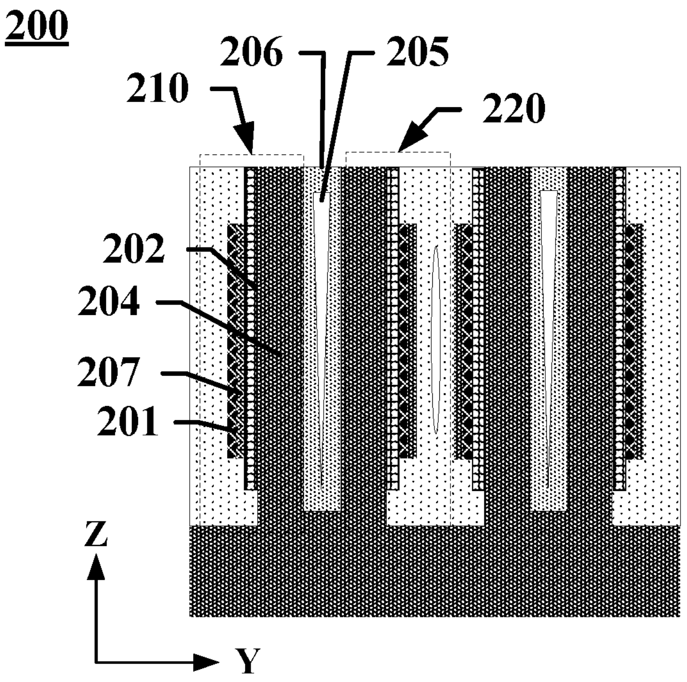
FIG. 2 is a sectional structure diagram of a vertical transistor in a semiconductor device as provided in an implementation of the present disclosure.

FIG. 2 is a schematic sectional diagram of a semiconductor device 200 as provided in an implementation of the present disclosure. As shown in FIG. 2, the semiconductor device 200 includes a first transistor 210 and a second transistor 220 juxtaposed in a Y axis direction and separated by a shield 206 including an airgap 205. The first transistor 210 includes, e.g., a gate 201 extending in a Z axis direction, a channel region 204 extending in the Z axis direction, a gate oxide layer 202 located between the gate 201 and the channel region 204 and extending in the Z axis direction, a bonding layer 207 located between the gate 201 and the gate oxide layer 202 and extending in the Z axis direction, and a source (not shown) and a drain (not shown) located on two ends of the channel region 204 opposite to each other in the Z axis direction. The gate 201 is located on a side of the channel region 204, where the gate 201 of the first transistor 210 is located on a side of the channel region 204 away from the shield 206, and the gate of the second transistor 220 is also located on a side of the channel region away from the shield 206. Likewise, the second transistor 220 has the same structure as the first transistor 210. With the vertical gate transistor structure shown in FIG. 2, it is possible to mitigate the coupling effect problem between adjacent first transistors 210 and second transistors 220 in the semiconductor device 200 by the shield 206. However, the semiconductor device 200 imposes high requirements for process control.

In an example of the present disclosure, there is an angle between the first direction and the second direction, there is an angle between the third direction and the plane in which the first direction and the second direction are in, and the angles are less than or equal to 90 degrees. For example, in some implementations of the present disclosure, the first direction is the X direction, the second direction is the Y direction, and the third direction is the Z direction.

Referring to FIGS. 3 to 27, some implementations of the present disclosure provide a semiconductor device 100 and a fabrication method thereof, as well as a memory system 300. In the present disclosure, the first isolation structure 13 and the second isolation structure 23 are disposed oppositely in the second direction Y and on the same side of the first direction X such that a leading-out space may be reserved, which improves space utilization while reducing process control requirements, and facilitates subsequent leading-out via the reserved space.

Figure 16:
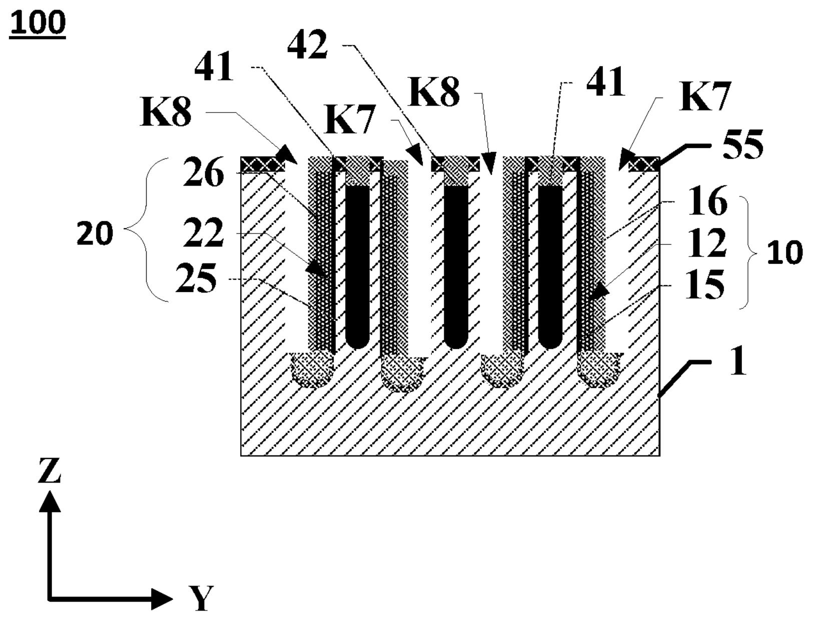
FIG. 16 is a sectional structure diagram along the I-I' cut-line in FIG. 13 or 14 as provided in an implementation of the present disclosure.
Figure 17:
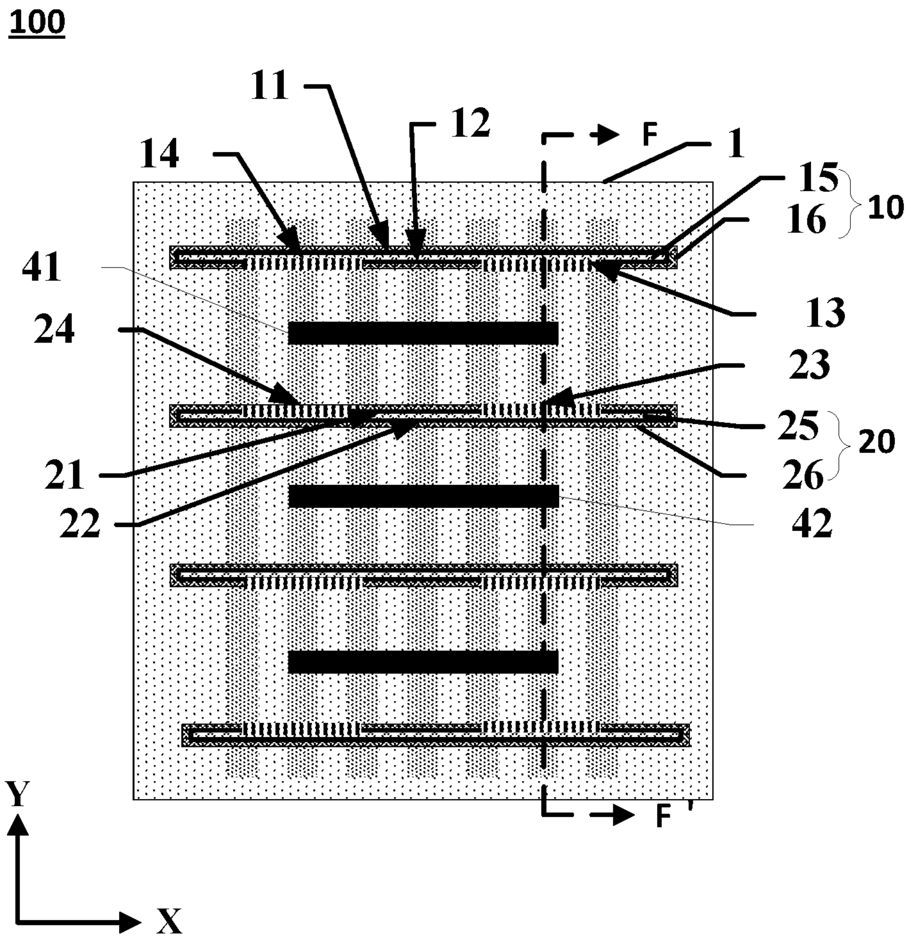
FIG. 17 is a top view of first to fourth isolation structures as provided in an implementation of the present disclosure.
Figure 18:
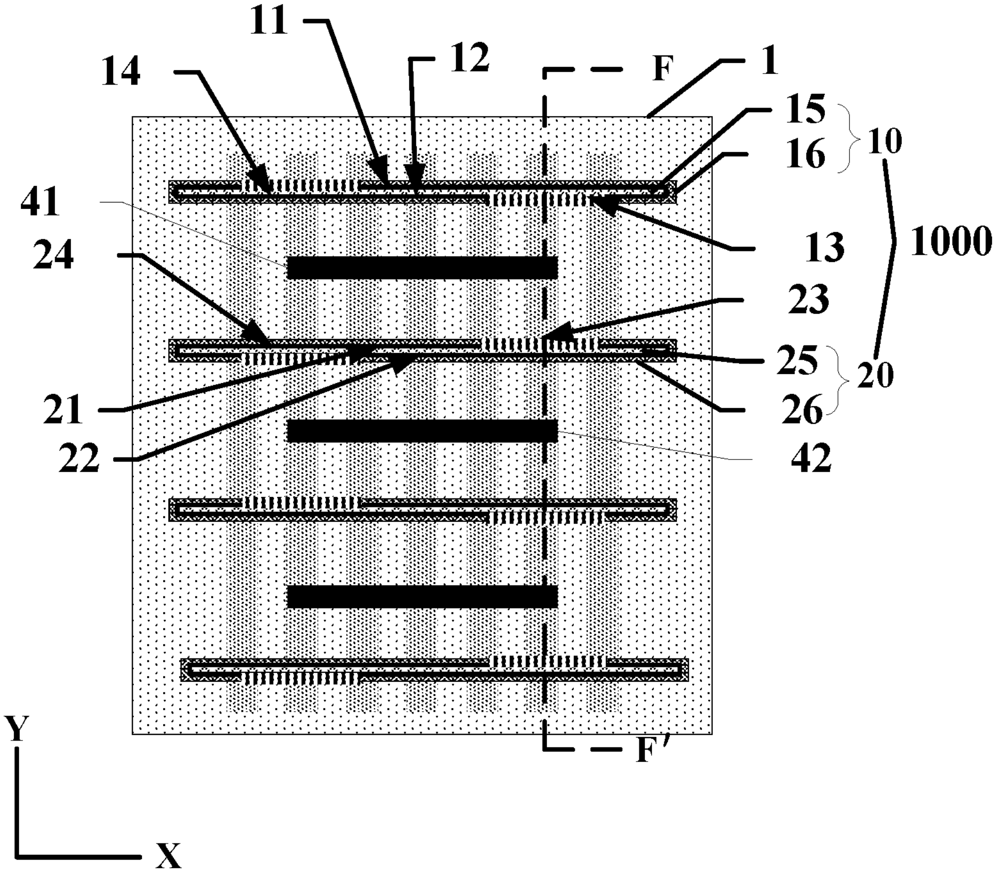
FIG. 18 is a top view of another first to fourth isolation structures as provided in an implementation of the present disclosure.
Figure 19:
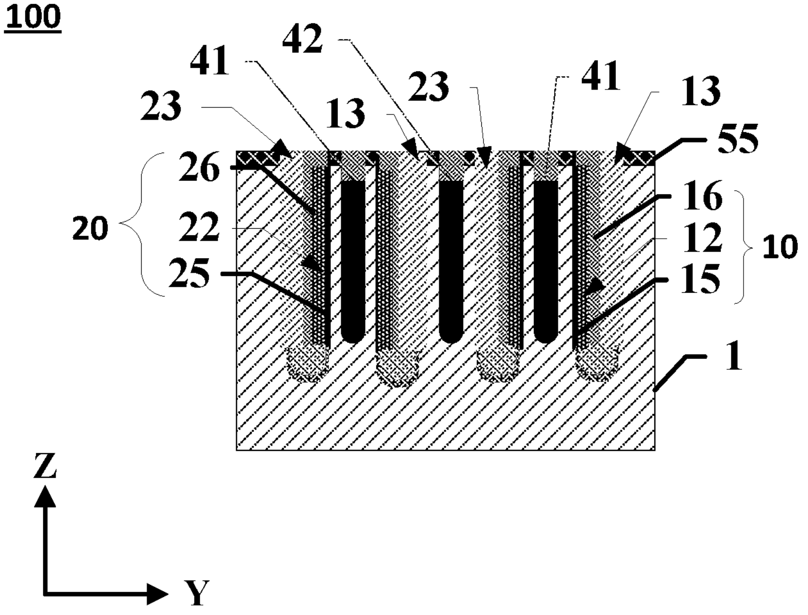
FIG. 19 is a sectional structure diagram along the F-F' cut-line in FIG. 17 or 18 as provided in an implementation of the present disclosure.

FIGS. 3-25 are schematic structure diagrams in the fabrication process of a semiconductor device 100 as provided by some implementations of the present disclosure. FIG. 17 is a top view of a structure of a semiconductor device 100 as provided in an implementation of the present disclosure. FIG. 18 is a top view of another structure of a semiconductor device 100 as provided in an implementation of the present disclosure. FIG. 19 is a sectional structure diagram of the semiconductor device 100 along the F-F' cut-line in FIG. 17 or 18 as provided in an implementation of the present disclosure. As shown in FIGS. 17, 18 and 19, the semiconductor device 100 includes a transistor array 1000 including a plurality of first gate structures 10 and second gate structures 20 extending in the first direction X and arranged alternatively in the second direction Y intersecting the first direction X.

Each of the first gate structures 10 includes a first gate line 11, a second gate line 12, and a first isolation structure 13 located between the first gate line 11 and the second gate line 12.

Each of the second gate structures 20 includes a third gate line 21, a fourth gate line 22, and a second isolation structure 23 located between the third gate line 21 and the fourth gate line 22.

The first isolation structures 13 and the second isolation structures 23 adjacent to each other in the second direction Y are disposed oppositely, and are both located on the same side in the first direction X.

In implementations of the present disclosure, as shown in FIGS. 17 to 19, the first isolation structure 13 and the second isolation structure 23 adjacent to each other in the second direction Y are disposed oppositely in the second direction Y, and the first isolation structure 13 and the second isolation structure 23 adjacent to each other in the second direction Y are both located on the first side in the first direction X; that is, the first isolation structure 13 and the second isolation structure 23 adjacent to each other in the second direction Y are disposed oppositely in the second direction Y and on the same side in the first direction X, as shown in FIGS. 17 to 19. As such, more space is reserved for the gate line leading-out structure in the following implementations corresponding to FIGS. 20 to 25 to perform the leading-out operations.

In some implementations, as shown in FIGS. 17 to 19, the first gate structure 10 further includes a third isolation structure 14 located between the first gate line 11 and the second gate line 12 and located on the other side in the first direction X; and the second gate structure 20 further includes a fourth isolation structure 24 located between the third gate line 21 and the fourth gate line 22 and located on the other side in the first direction X, where the third isolation structure 14 and the fourth isolation structure 24 adjacent to each other in the second direction Y are disposed oppositely.

As shown in FIGS. 17 to 19, each of the first gate structures 10 includes a first gate line 11 and a second gate line 12, a first isolation structure 13 located between the first gate line 11 and the second gate line 12 and on the first side in the first direction X, and a third isolation structure 14 located between the first gate line 11 and the second gate line 12 and on the second side in the first direction X. That is, the first isolation structure 13 and the third isolation structure 14 separate the first gate structure 10 into the first gate line 11 and the second gate line 12. The first isolation structure 13 and the third isolation structure 14 in the first gate structure 10 may have the same or different sizes in the first direction X. Assuming that the first isolation structure 13 and the third isolation structure 14 have the same size in the first direction X, in the example shown in FIG. 17, the first gate line 11 has a size in the first direction X greater than the size of the second gate line 12 in the first direction X. In the example shown in FIG. 18, the first gate line 11 has a size in the first direction X equal to the size of the second gate line 12 in the first direction X.

As shown in FIGS. 17 to 19, each of the second gate structures 20 includes a third gate line 21 and a fourth gate line 22, a second isolation structure 23 located between the third gate line 21 and the fourth gate line 22 and on the first side in the first direction X, and a fourth isolation structure 24 located between the third gate line 21 and the fourth gate line 22 and on the second side in the first direction X. That is, the second isolation structure 23 and the fourth isolation structure 24 separate the second gate structure 20 into the third gate line 21 and the fourth gate line 22. The second isolation structure 23 and the fourth isolation structure 24 in the second gate structure 20 may have the same or different sizes in the first direction X. Assuming that the second isolation structure 23 and the fourth isolation structure 24 have the same size in the first direction X, in the example shown in FIG. 17, the third gate line 21 has a size in the first direction X greater than the size of the fourth gate line 22 in the first direction X. In the example shown in FIG. 18, the third gate line 21 has a size in the first direction X equal to the size of the fourth gate line 22 in the first direction X.

As shown in FIGS. 17 to 19, the first isolation structure 13 and the second isolation structure 23 adjacent to each other in the second direction Y are disposed oppositely in the second direction Y, and the first isolation structure 13 and the second isolation structure 23 adjacent to each other in the second direction Y are both located on the first side in the first direction X, that is, the first isolation structure 13 and second isolation structure 23 are disposed oppositely in the second direction Y and on the first side in the first direction X, as shown in FIGS. 17 to 19. Additionally, the third isolation structure 14 and the fourth isolation structure 24 adjacent to each other in the second direction Y are disposed oppositely in the second direction Y, and the third isolation structure 14 and the fourth isolation structure 24 adjacent to each other in the second direction Y are both located on the second side in the first direction X; that is, the third isolation structure 14 and fourth isolation structure 24 are disposed oppositely in the second direction Y and on the second side in the first direction X, as shown in FIGS. 17 to 18. Such a configuration may reserve more space for the gate line leading-out structure that will be described in implementations below to perform the leading-out operations. Also, the leading out of a plurality of gate lines is performed alternatively at two ends of the plurality of gate lines in the first direction X based on odd and even numbers, which simplifies the fabrication process flow and reduces the fabrication cost.

Figure 21:
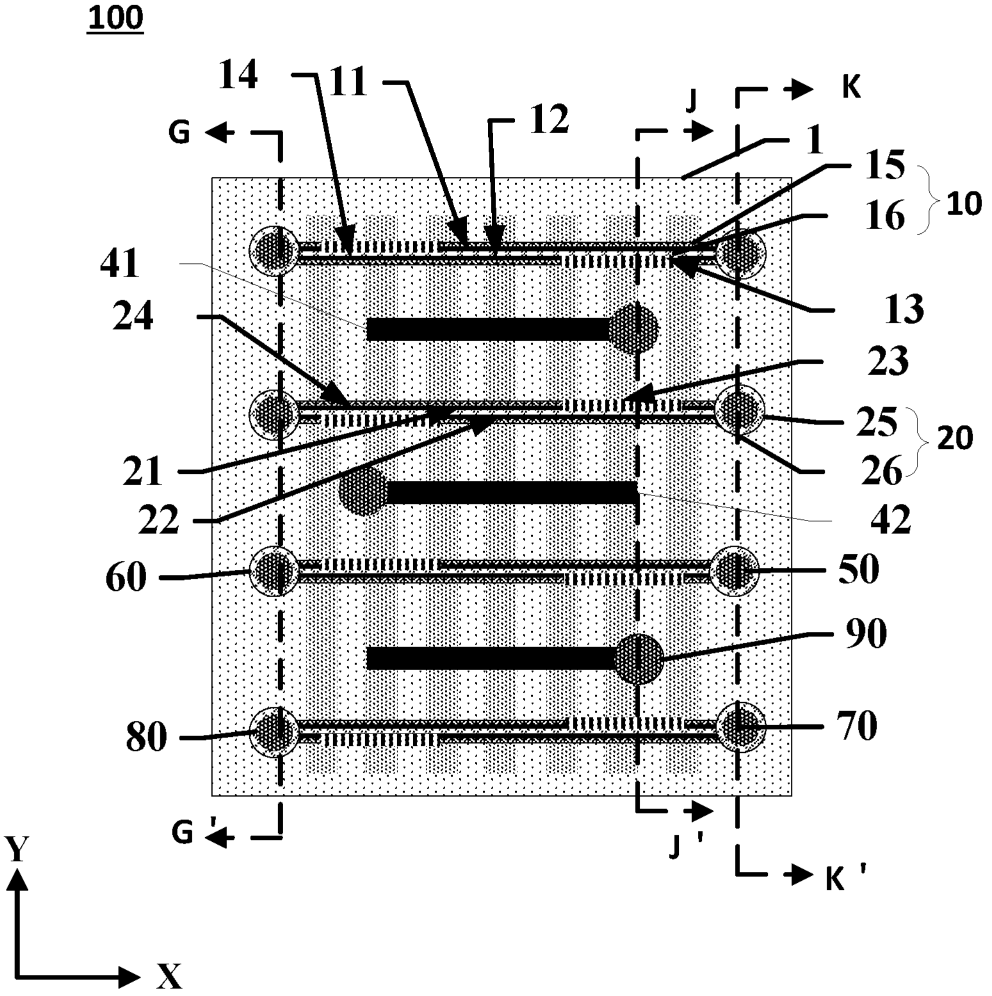
FIG. 21 is a top view of another first to fourth leading-out structures and shielding leading-out structures as provided in an implementation of the present disclosure.
Figure 24:
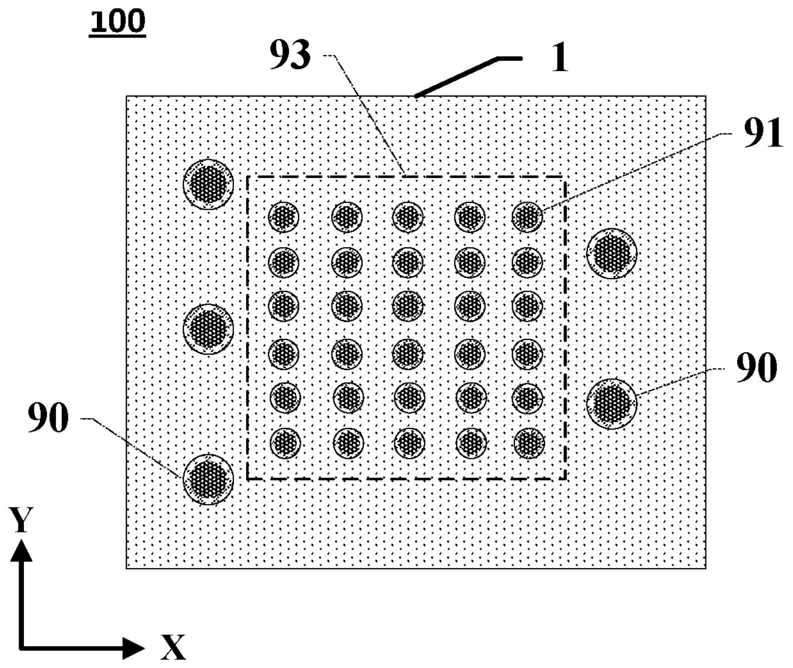
FIG. 24 is a top view of a shielding leading-out structure and a capacitor array as provided in an implementation of the present disclosure.

It is to be noted that as shown in FIGS. 18, 21, and 24, the first isolation structure 13 is located on the first side of the first gate structure 10 in the first direction X, and the third isolation structure 14 is located on the second side of the first gate structure 10 in the first direction X; the second isolation structure 23 is located on the first side of the second gate structure 20 in the first direction X, and the fourth isolation structure 24 is located on the second side of the second gate structure 20 in the first direction X; and the first isolation structure 13 and the third isolation structure 14 in the first gate structure 10 are located on two opposite sides of the capacitor array 93 shown in FIG. 24 in the first direction respectively, and the second isolation structure 23 and the fourth isolation structure 24 in the second gate structure 20 are located on two opposite sides of the capacitor array 93 shown in FIG. 24 in the first direction, respectively.

In some implementations, the first isolation structure 13 and the third isolation structure 14 of the same first gate structure 10 are located on different sides in the second direction Y, and the second isolation structure 23 and the fourth isolation structure 24 of the same second gate structure 20 are located on different sides in the second direction Y.

In implementations of the present disclosure, as shown in FIGS. 18 and 19, the first isolation structure 13 and the second isolation structure 23 adjacent to each other in the second direction Y are disposed oppositely in the second direction Y, and the first isolation structure 13 and the second isolation structure 23 adjacent to each other in the second direction Y are both located on the first side in the first direction X, and the first isolation structure 13 and the third isolation structure 14 of the same first gate structure 10 are located on different sides in the second direction Y; that is, the first isolation structure 13 and the second isolation structure 23 are disposed face to face in the second direction Y and on the first side in the first direction X, as shown in FIGS. 18 and 19. The third isolation structure 14 and the fourth isolation structure 24 adjacent to each other in the second direction Y are disposed oppositely in the second direction Y, and the third isolation structure 14 and the fourth isolation structure 24 adjacent to each other in the second direction Y are both located on the second side in the first direction X, and the second isolation structure 23 and the fourth isolation structure 24 of the same second gate structure 20 are located on different sides in the second direction Y; that is, the third isolation structure 14 and the fourth isolation structure 24 are disposed back to back in the second direction Y and on the second side in the first direction X, as shown in FIGS. 18 and 19. Such a configuration may reserve more space for the gate line leading-out structure in implementations below to perform leading-out operations. At the same time, the leading out of a plurality of gate lines is performed alternatively at two ends of the plurality of gate lines in the first direction X based on odd and even numbers in the order of rows in the second direction Y, which simplifies the fabrication process flow and reduces the fabrication cost.

In some implementations, the first gate structure 10 further includes a first spacer structure 15 located between the first gate line 11 and the second gate line 12 and extending in the first direction X, and a first oxide layer 16 on outer sides of the first gate line 11 and the second gate line 12 away from each other.

The second gate structure 20 further includes a second spacer structure 25 located between the third gate line 21 and the fourth gate line 22 and extending in the first direction X, and a second oxide layer 26 on outer sides of the third gate line 21 and the fourth gate line 22 away from each other.

In implementations of the present disclosure, each of the first gate structure 10 and the second gate structure 20 includes a spacer structure and an oxide layer. The first gate structure 10 is separated into the first gate line 11 and the second gate line 12 by the first isolation structure 13 and the third isolation structure 14, and the second gate structure 20 is separated into the third gate line 21 and the fourth gate line 22 by the second isolation structure 23 and the fourth isolation structure 24. A first oxide layer 16 extending in the first direction X and the third direction Z is disposed between the semiconductor pillar 31 and the first gate line 11 of the first gate structure 10 in the second direction Y; and additionally, a first spacer structure 15 extending in the first direction X and the third direction Z is disposed between the first gate line 11 of the first gate structure 10 and the first oxide layer 16 in the second direction Y. The first oxide layer 16 in the present disclosure is located on the outermost side of the first gate structure 10, and the first spacer structure 15 is located between the first oxide layer 16 and the first gate line 11 or the second gate line 12. As shown in FIGS. 11 to 19 and 25, in the second direction Y, a semiconductor pillar 31, the first oxide layer 16 in the first gate structure 10, the first gate line 11, the first spacer structure 15, the second gate line 12, the first oxide layer 16 and another semiconductor pillar 31 are arranged sequentially. Likewise, the second gate structure 20 also further includes a second oxide layer 26 and a second spacer structure 25, and the second gate structure 20 has the same structure and arrangement as the first gate structure 10, which will not be described in detail herein.

In some examples, the first oxide layer 16 and the second oxide layer 26 may include silicon oxide, silicon oxynitride, etc.

In some examples, the first spacer structure 15 and the second spacer structure 25 may include any one or combination of insulating materials such as silicon oxide, silicon nitride, silicon oxynitride, aluminum oxide, polysilicone or polysilizane, etc.

In some implementations, the semiconductor device 100 further includes a plurality of shielding structures 40 extending in the first direction X and located between the first gate structures 10 and the second gate structures 20 adjacent to each other in the second direction Y.

In implementations of the present disclosure, as shown in FIGS. 11 to 25, the semiconductor device 100 further includes a plurality of shielding structures 40 extending in the first direction X and the third direction. In the second direction Y, the first gate structures 10 and the second gate structures 20 are disposed alternatively, and a shielding structure 40 is disposed between the first gate structure 10 and the second gate structure 20 adjacent to each other in the second direction Y.

In some examples, the shielding structure 40 may include conductive materials including, but not limited to tungsten (W), cobalt (Co), copper (Cu), aluminum (Al), silicide, or any combination thereof.

In some implementations, the size of the shielding structure 40 in the first direction X is greater than the size of the first gate structure 10 or the second gate structure 20 in the first direction X.

In implementations of the present disclosure, with continuous increase of the density of semiconductor memory device, the memory cell has a smaller and smaller volume, word lines in memory cells are physically closer and closer, and capacitive coupling between adjacent word lines is becoming larger and larger. When the access times of a certain row of memory cells exceed a threshold, data abnormality might occur at nearby rows, which is typically known as the row hammer effect. Row hammer effect refers to a phenomenon in which when a certain word line is accessed continuously and repeatedly in a certain period, another adjacent word line that shares bit line 92 with the word line would be turned on so that information in the capacitor might be lost. The projection size of the first gate structure 10 in the second direction Y is equal to the projection size of the second gate structure 20 in the second direction Y, and the projection size of the shielding structure 40 in the second direction Y is greater than the projection size of the first gate structure 10 in the second direction Y. That is to say, the projection size of the shielding structure 40 in the second direction includes the projection size of the first gate structure 10 or the second gate structure 20 in the second direction Y; that is, the size of the shielding structure 40 in the first direction X is greater than the size of the gate structure (including the first gate structure 10 and the second gate structure 20) in the first direction X. Thus, it is possible to allow the shielding structure 40 to be led out via the region at the end of the gate structure that extends in the first direction X, which not only facilitates leading out but also eliminates row hammer effect. For the semiconductor device 100 of the present disclosure, the fabrication cost is low, the yield loss problem due to the row hammer effect is mitigated, and the process consistence requirements is reduced to simplify fabrication process.

In some implementations, the size of the shielding structure 40 in the first direction X is smaller than the size of the first gate structure 10 or the second gate structure 20 in the first direction X.

In an implementation of the present disclosure, the projection size of the first gate structure 10 in the second direction Y is equal to the projection size of the second gate structure 20 in the second direction Y, and the projection size of the shielding structure 40 in the second direction Y is smaller than the projection size of the first gate structure 10 in the second direction Y. That is to say, the projection size of the first gate structure 10 or the second gate structure 20 in the second direction Y includes the projection size of the shielding structure 40 in the second direction, that is, the size of the shielding structure 40 in the first direction X may be smaller than the size of the gate structure (including the first gate structure 10 and the second gate structure 20) in the first direction X. Thus, it is possible to allow the shielding structure 40 to be led out in the first direction X via the reserved region for the first isolation structure 13 and the second isolation structure 23 disposed oppositely in the second direction Y, which not only facilitates leading out but also eliminates row hammer effect. For the semiconductor device 100 of the present disclosure, the fabrication cost is low, and the yield loss problem due to the row hammer effect is mitigated. At the same time, it is also possible to decrease the material consumption when forming the shielding structure 40 through deposition, hence further reducing the fabrication cost. Since the amount of the conductive material used to form the shielding structure 40 by deposition is reduced, it is possible to reduce the time for fabricating the semiconductor device 100 and also improve the production efficiency of the semiconductor device 100.

Figure 20:
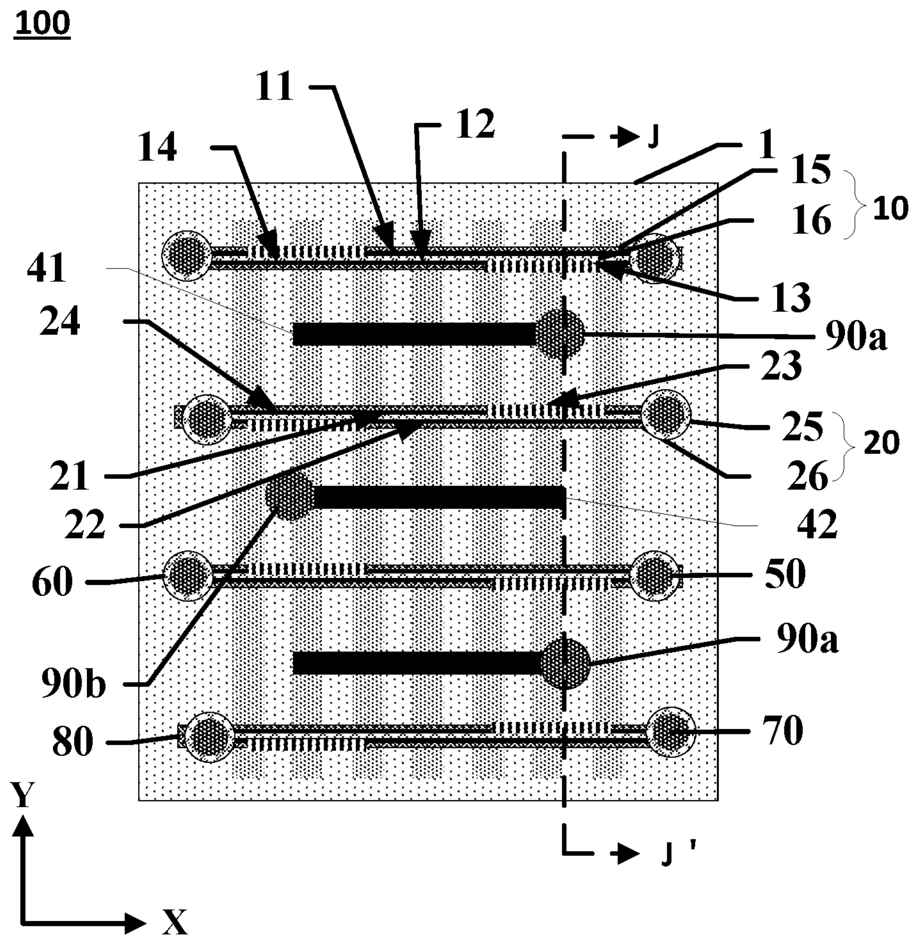
FIG. 20 is a top view of first to fourth leading-out structures and shielding leading-out structures as provided in an implementation of the present disclosure.
Figure 22:
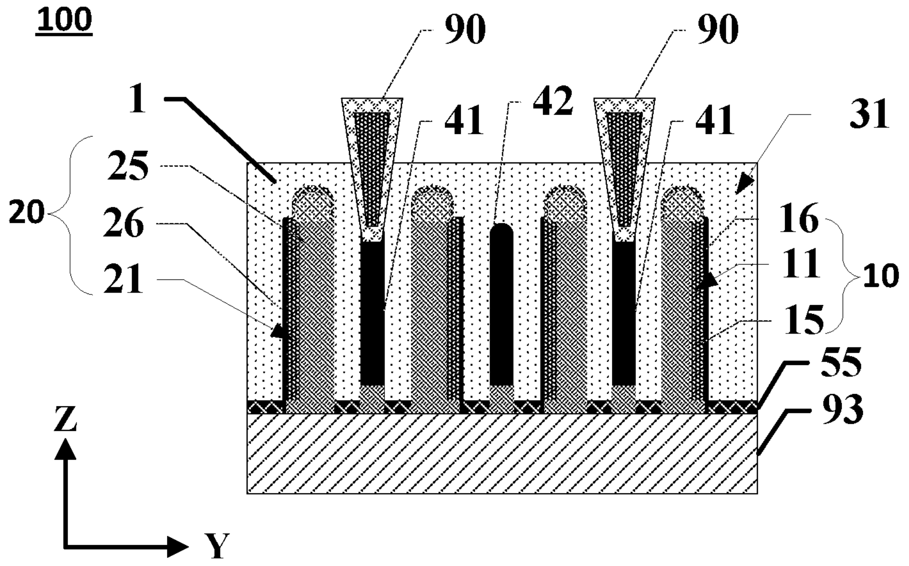
FIG. 22 is a sectional structure diagram along the J-J' cut-line in FIG. 20 or 21 as provided in an implementation of the present disclosure.
Figure 25:
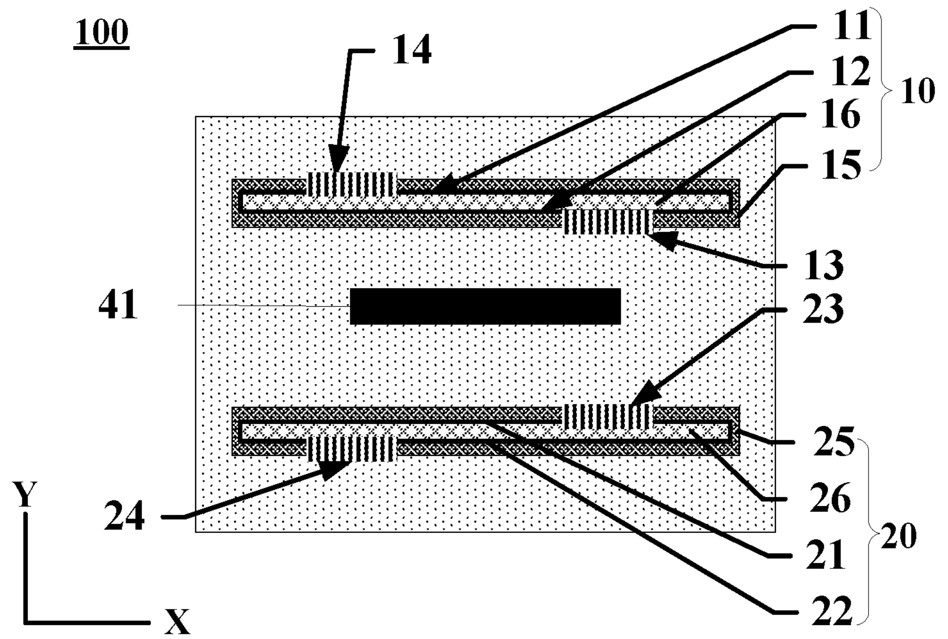
FIG. 25 is an enlarged top view of first to fourth isolation structures in FIGS. 17 and 18 as provided in an implementation of the present disclosure.

FIGS. 3-25 are schematic diagrams in the fabrication process of a semiconductor device 100 as provided by some implementations of the present disclosure. The semiconductor device 100 will be described first, where FIG. 20 is a top view of a structure of a semiconductor device 100 as provided in an implementation of the present disclosure, FIG. 21 is a top view of another structure of a semiconductor device 100 as provided in an implementation of the present disclosure, and FIGS. 22 and 25 are two sectional structure diagrams of the semiconductor device 100 along the J-J' cut-line in FIGS. 20 and 21 as provided in an implementation of the present disclosure respectively. As shown in FIGS. 20 to 25, the semiconductor device 100 includes a transistor array 1000 including a plurality of first gate structures 10 and second gate structures 20 extending in the first direction X and arranged alternatively in the second direction Y intersecting the first direction X.

Each of the first gate structures 10 includes a first gate line 11, a second gate line 12, and a first isolation structure 13 located between the first gate line 11 and the second gate line 12.

Each of the second gate structures 20 includes a third gate line 21, a fourth gate line 22, and a second isolation structure 23 located between the third gate line 21 and the fourth gate line 22.

The semiconductor device 100 further includes a first gate line leading-out structure 50 on the first side of the first gate structure 10 in the first direction X and connected with the first gate line 11, and a second gate line leading-out structure 60 on the second side of the first gate structure 10 in the first direction X and connected with the second gate line 12; and a third gate line leading-out structure 70 on the first side of the second gate structure 20 in the first direction X and connected with the third gate line 21, and a fourth gate line leading-out structure 80 on the second side of the second gate structure 20 in the first direction X and connected with the fourth gate line 22, where the first isolation structure 13 and the second isolation structure 23 adjacent to each other in the second direction Y are disposed oppositely, and are both located on the same side in the first direction X.

In implementations of the present disclosure, the above-described implementations corresponding to FIGS. 2 to 19 may be referred to for the contents same as the semiconductor device 100 fabricated with the fabrication process shown in FIGS. 2 to 19. The semiconductor device 100 of the present implementation is different from the semiconductor device 100 corresponding to FIGS. 17 to 19 in that gate line leading-out structures are disposed at end portions of both the first gate structure 10 and the second gate structure 20 in the present implementation. In an example, as shown in FIGS. 20, 21, and 22, the semiconductor device 100 includes a plurality of first gate structures 10 and second gate structures 20 extending in the first direction X and arranged alternatively in the second direction Y. As shown in FIGS. 20 to 22, the first isolation structure 13 and the second isolation structure 23 adjacent to each other in the second direction Y are disposed oppositely in the second direction Y and on the first side in the first direction X, and a first gate line leading-out structure 50 connected with the first gate line 11 is disposed at the first end of the first gate structure 10 in the first direction X to lead out the first gate line 11. A second gate line leading-out structure 60 connected with the second gate line 12 is disposed at the second end of the first gate structure 10 in the first direction X to lead out the second gate line 12. Likewise, a third gate line leading-out structure 70 connected with the third gate line 21 is disposed at the first end of the second gate structure 20 in the first direction X to lead out the third gate line 21. A fourth gate line leading-out structure 80 connected with the fourth gate line 22 is disposed at the second end of the second gate structure 20 in the first direction X to lead out the fourth gate line 22.

In some implementations, the first gate structure 10 further includes a third isolation structure 14 located between the first gate line 11 and the second gate line 12 and on the other side in the first direction X; and the second gate structure 20 further includes a fourth isolation structure 24 located between the third gate line 21 and the fourth gate line 22 and on the other side in the first direction X, where the third isolation structure 14 and the fourth isolation structure 24 adjacent to each other in the second direction Y are disposed oppositely.

In an example, the first gate structure 10 includes the first isolation structure 13 and the third isolation structure 14 located between the first gate line 11 and the second gate line 12, and the second gate structure 20 includes the second isolation structure 23 and the fourth isolation structure 24 located between the third gate line 21 and the fourth gate line 22. The first isolation structure 13 and the second isolation structure 23 are located on the first ends of the first gate structure 10 and the second gate structure 20 in the first direction X respectively and are disposed oppositely in the second direction Y, and the third isolation structure 14 and the fourth isolation structure 24 are located on the second ends of the first gate structure 10 and the second gate structure 20 in the first direction X respectively and are disposed oppositely in the second direction Y. Thus, the first isolation structure 13 and the third isolation structure 14 are located on the first side and second side of the first gate structure 10 in the first direction X respectively, and thus, separate the first gate structure 10 into the first gate line 11 and the second gate line 12. The second isolation structure 23 and the fourth isolation structure 24 are located on the first side and second side of the second gate structure 20 in the first direction X respectively, and thus, separate the second gate structure 20 into the third gate line 21 and the fourth gate line 22.

In some implementations, the first isolation structure 13 and the third isolation structure 14 of the same first gate structure 10 are located on different sides in the second direction Y, and the second isolation structure 23 and the fourth isolation structure 24 of the same second gate structure 20 are located on different sides in the second direction Y.

In implementations of the present disclosure, as shown in FIGS. 18 and 19, the first isolation structure 13 and the second isolation structure 23 adjacent to each other in the second direction Y are disposed oppositely in the second direction Y, and the first isolation structure 13 and the second isolation structure 23 adjacent to each other in the second direction Y are both located on the first side in the first direction X, and the first isolation structure 13 and the third isolation structure 14 of the same first gate structure 10 are located on different sides in the second direction Y; that is, the first isolation structure 13 and the second isolation structure 23 are disposed face to face in the second direction Y and on the first side in the first direction X, as shown in FIGS. 18 and 19. The third isolation structure 14 and the fourth isolation structure 24 adjacent to each other in the second direction Y are disposed oppositely in the second direction Y, and the third isolation structure 14 and the fourth isolation structure 24 adjacent to each other in the second direction Y are both located on the second side in the first direction X, and the second isolation structure 23 and the fourth isolation structure 24 of the same second gate structure 20 are located on different sides in the second direction Y; that is, the third isolation structure 14 and the fourth isolation structure 24 are disposed back to back in the second direction Y and on the second side in the first direction X, as shown in FIGS. 18 and 19. Thus, it is possible to reserve more space for the gate line leading-out structure in implementations below to perform leading-out operation. At the same time, the leading out of a plurality of gate lines is performed alternatively at two ends of the plurality of gate lines in the first direction X based on odd and even numbers in the order of rows in the second direction Y, which simplifies the fabrication process flow and reduces the fabrication cost.

In some implementations, the semiconductor device 100 further includes a plurality of shielding structures 40 extending in the first direction X and located between the first gate structures 10 and the second gate structures 20 adjacent to each other in the second direction Y. As shown in FIGS. 11 to 25, relevant description of the above-described implementations corresponding to FIGS. 11 to 25 may be referred to for the shielding structure 40 in the present implementation, which will not be described any more here.

In some implementations, the semiconductor device 100 further includes a shield leading-out structure 90 connected with an end of the shielding structure 40 in the first direction X.

In implementations of the present disclosure, the semiconductor device 100 further includes a shield leading-out structure 90 as shown in FIGS. 20 and 21, which is disposed at an end of the shielding structure 40 in the first direction X. As shown in FIGS. 20 and 21, a plurality of shield leading-out structures 90 may be disposed at the first ends of the shielding structures 40 in the first direction X. Of course, a plurality of shield leading-out structures 90 may also be disposed at the second ends of the shielding structures 40 in the first direction X. Alternatively, the plurality of shield leading-out structures 90 may also be disposed at the first ends and the second ends of the shielding structures 40 in the first direction X, and the shield leading-out structures 90 disposed on the plurality of first ends and the plurality of second ends are led out alternatively at the first ends and the second ends of the shielding structures 40 based upon odd and even numbers in the order of rows in the second direction Y.

In some implementations, the plurality of shielding structures 40 include odd-numbered rows of shielding structures 41 and even-numbered rows of shielding structures 42 arranged alternatively in the second direction Y, and the plurality of shield leading-out structures 90 are connected with the first ends of the odd-numbered rows of shielding structures 41 and the second ends of the even-numbered rows of shielding structures 42, respectively. The first end and the second end are two opposite ends of an individual shielding structure 40 in the first direction X.

In implementations of the present disclosure, as shown in FIGS. 20 and 21, the plurality of shielding structures 40 include odd-numbered rows of shielding structures 41 and even-numbered rows of shielding structures 42 arranged alternatively in the second direction Y. As shown in FIGS. 20 to 25, a shield leading-out structure 90 extending in the third direction Z is connected at the first end of each odd-numbered row of shielding structure 41, and a shield leading-out structure 90 extending in the third direction Z is connected at the second end of each even-numbered row of shielding structure 42, such that the plurality of shield leading-out structures 90 are lead out alternatively at the first ends of the odd-numbered rows of shielding structures 41 and the second ends of the even-numbered rows of shielding structures 42 in the order of rows in the second direction Y. Here, the odd-numbered rows of shielding structures 41 and the even-numbered rows of shielding structures 42 are arranged alternatively in the second direction Y.

In some implementations, the shield leading-out structure 90 is located between the first isolation structure 13 and the second isolation structure 23 adjacent to each other or between the third isolation structure 14 and the fourth isolation structure 24 adjacent to each other.

In the implementation of the present disclosure, as shown in FIGS. 20 to 25, the plurality of shield leading-out structures 90 include the first shield leading-out structures 90*a* and the second shield leading-out structures 90*b*. A first shield leading-out structures 90*a* connected with the first end of the odd-numbered row of shielding structure 41 is disposed between a first isolation structure 13 and a second isolation structure 23 adjacent in the second direction Y, and a second shield leading-out structures 90*b* connected with the second end of the even-numbered row of shielding structure 42 is disposed between a third isolation structure 14 and a fourth isolation structure 24 adjacent in the second direction Y. The first shield leading-out structure 90*a* and the second shield leading-out structure 90*b* are disposed oppositely in the first direction X and are disposed oppositely in the second direction Y. The presence of isolation structures results in a larger landing window for shield leading-out structures, therefore as shown in FIGS. 20 to 25, the first shield leading-out structures 90*a* and the second shield leading-out structures 90*b* are arranged alternatively in the first direction X and the second direction Y to correspond to the arrangement positions of respective isolation structures, that is, the position of a first shield leading-out structure 90*a* corresponds to positions of its adjacent first isolation structure 13 and second isolation structure 23, and the position of a second shield leading-out structure 90*b* corresponds to positions of its adjacent third isolation structure 14 and fourth isolation structure 24, such that the spacing between leading-out paths of the shielding structures 40 is increased and the device size may be reduced, and the space utilization may be improved as well.

In some implementations, the device further includes: a semiconductor pillar array 30 including a plurality of semiconductor pillars 31 arranged in an array along the first direction X and the second direction Y and extending in the third direction Z intersecting the first direction X and the second direction Y, where each semiconductor pillar 31 is located between adjacent shielding structure 40 and first gate structure 10 or second gate structure 20; a capacitive structure 91 located on a side of the semiconductor pillar 31 in the third direction Z and connected with the semiconductor pillar 31 and a common end, and extending in the third direction Z; and a bit line located on the other side of the semiconductor pillar 31 in the third direction Z and extending in the first direction X and connected with the semiconductor pillar 31.

In the implementation of the present disclosure, the semiconductor device 100 includes a semiconductor pillar array 30 and a transistor array 1000. Here, the semiconductor pillar array 30 includes a plurality of semiconductor pillars 31 arranged in an array along the first direction X and the second direction Y and extending in the third direction Z, and the first direction X, the second direction Y, and the third direction Z intersect each other. The semiconductor pillar 31 is configured to transfer charges or stop transferring charges under the action of an external electric field to turn on or off a transistor. The extending direction of each semiconductor pillar 31 is the direction in which current flows when the transistor is turned on. Illustratively, as shown in FIGS. 9 and 10, the extending direction of the semiconductor pillar

31 is the third direction Z and a plurality of semiconductor pillars 31 are arranged in an array along the first direction X and the second direction Y to form the semiconductor pillar array 30.

Figure 9:
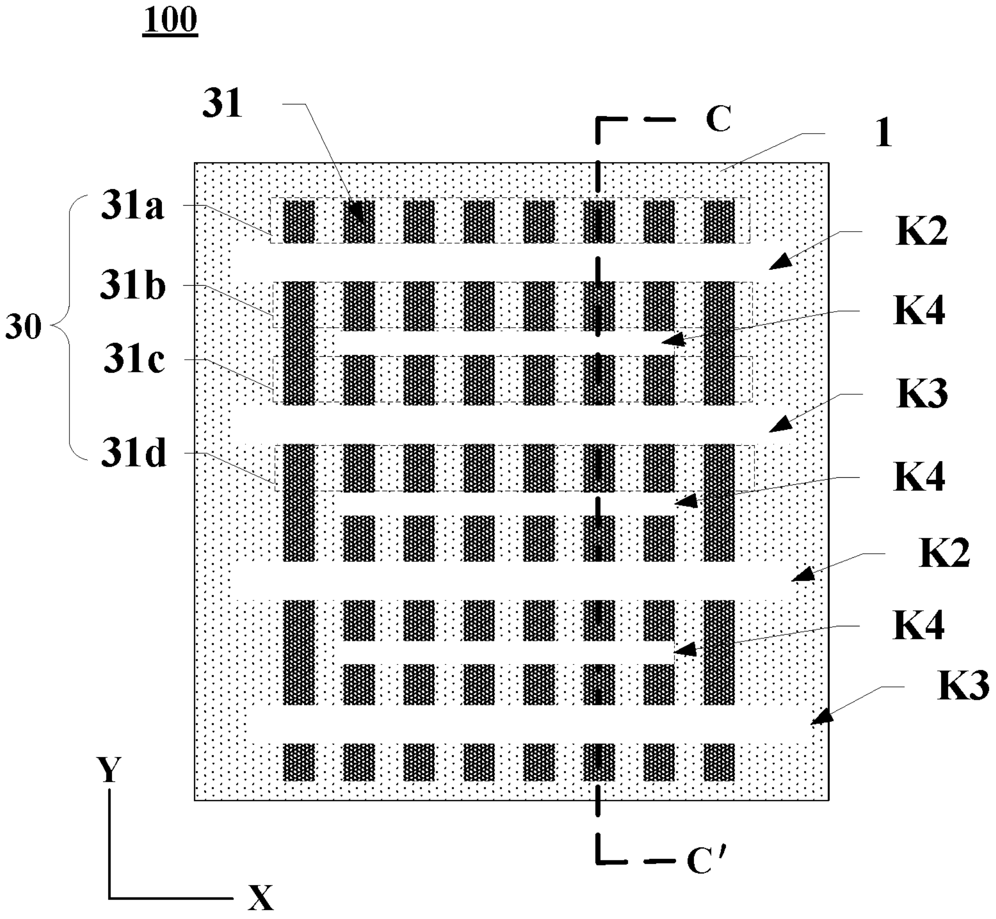
FIG. 9 is a top view of forming a first gate trench, a second gate trench and a shielding trench as provided in an implementation of the present disclosure.
Figure 10:
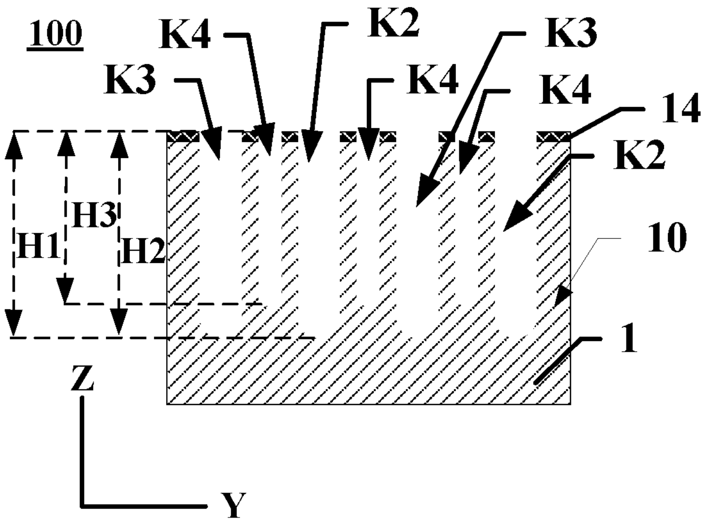
FIG. 10 is a sectional structure diagram along the C-C' cut-line in FIG. 9 as provided in an implementation of the present disclosure.

As shown in FIGS. 9, 20 and 21, the plurality of semiconductor pillars 31 include a first row of semiconductor pillars 31*a*, a second row of semiconductor pillars 31*b*, a third row of semiconductor pillars 31*c* and a fourth row of semiconductor pillars 31*d* arranged along the first direction X and adjacent in the second direction Y. In the second direction Y, the first gate structure 10 is located between the first row of semiconductor pillars 31*a* and the second row of semiconductor pillars 31*b*. In the second direction Y, the odd-numbered row of shielding structure 41 is located between the second row of semiconductor pillars 31*b* and the third row of semiconductor pillars 31*c*. In the second direction Y, the second gate structure 20 is located between the third row of semiconductor pillars 31*c* and the fourth row of semiconductor pillars 31*d*. In the second direction Y, the even-numbered row of shielding structure 42 is located between the fourth row of semiconductor pillars 31*d* and another first row of semiconductor pillars 31*a* (adjacent to the fourth row of semiconductor pillars 31*d* in the second direction Y).

The semiconductor device 100 in the implementations of the present disclosure further includes a capacitor array 93 located at an end of the semiconductor pillar array 30 in the third direction Z. The capacitor array 93 includes a plurality of capacitive structures 91 arranged in an array in the first direction X and the second direction Y and extending in the third direction Z. Each capacitive structure 91 includes a first electrode layer (not shown) connected with a side of the semiconductor pillar 31 in the third direction Z, a second electrode layer (not shown), and a capacitor dielectric layer (not shown) in the first electrode layer, where the second electrode layer is connected with the common end. The semiconductor device 100 further includes a bit line 92 located on the other side of the semiconductor pillar 31 in the third direction Z and connected with the drain of the semiconductor pillar 31, and extending in the first direction X.

A gate line is formed on the sidewall of each semiconductor pillar 31 in the semiconductor array, and gate lines for semiconductor pillars 31 in the same column (e.g., semiconductor pillars 31 arranged with intervals in the second direction Y) are connected to form a word line. A source (not shown) is formed at an end of each semiconductor pillar 31 in the transistor array 1000 in the third direction Z and connected with the first electrode layer of the capacitive structure 91. A drain (not shown) is formed at the other end of each semiconductor pillar 31 in the transistor array 1000 in the third direction Z, and drains of semiconductor pillars 31 in the same row (e.g., semiconductor pillars 31 arranged with intervals in the first direction X) are connected to form a bit line 92 (not shown). In the above-described semiconductor device 100, the semiconductor pillar 31 extends in the third direction Z, the source and drain are formed at two opposite ends of the semiconductor pillar 31 in the third direction Z respectively, and the capacitive structure 91 and the bit line 92 are located at two opposite sides of the semiconductor pillar 31 in the third direction Z respectively, such that they may be fabricated on two sides of the substrate 1 respectively and the fabrication efficiency is improved.

It is appreciated that the source and drain of a semiconductor pillar 31 are relative concepts. The source and drain may be on any surface of the semiconductor pillar 31 in the third direction Z.

In some examples, the common end may include the low voltage end or the grounding end, wherein the low voltage may include −0.5V, −1V etc. In some implementations, the shielding structures 40 are connected with the common end through the shield leading-out structures 90. In practical applications, it is possible to configure the shielding structures 40 to be powered separately rather than being connected with the common end. In some implementations of the present disclosure, applying a low voltage to the shielding structures 40 or grounding the shielding structures 40 via the shield leading-out structures 90 may enable the shielding structures 40 to shield interference between adjacent semiconductor pillars 31.

In some implementations, the first gate line leading-out structure 50 and the second gate line leading-out structure 60 are located at an end of the first gate structure 10 away from the capacitive structure 91 in the third direction Z, the third gate line leading-out structure 70 and the fourth gate line leading-out structure 80 are located at an end of the second gate structure 20 away from the capacitive structure 91 in the third direction Z, and the shield leading-out structure 90 is located at an end of the shielding structure 40 away from the capacitive structure 91 in the third direction Z.

In the implementation of the present disclosure, as shown in FIGS. 20, 21, and 22, the shield leading-out structure 90 is connected with the shielding structure 40 and located on a side in the third direction Z away from the capacitive structure 91. The first gate line 11 in the first gate structure 10 is connected with the first gate line leading-out structure 50 that is located on a side of the first gate line 11 away from the capacitive structure 91 in the third direction Z. The second gate line 12 in the first gate structure 10 is connected with the second gate line leading-out structure 60 that is located on a side of the second gate line 12 away from the capacitive structure 91 in the third direction Z. Likewise, the third gate line 21 in the second gate structure 20 is connected with the third gate line leading-out structure 70 that is located on a side of the third gate line 21 away from the capacitive structure 91 in the third direction Z. The fourth gate line 22 in the second gate structure 20 is connected with the fourth gate line leading-out structure 80 that is located on a side of the fourth gate line 22 away from the capacitive structure 91 in the third direction Z. That is, the first to fourth gate line leading-out structures 50 to 80 and the shield leading-out structure 90 are all located on a side away from the capacitive structure 91 (or capacitor array 93) in the third direction Z. Assuming that in the semiconductor device 100, the side on which the capacitive structure 91 (or capacitor array 93) is located in the third direction Z is the front side, the first gate line leading-out structures 50, the second gate line leading-out structures 60, the third gate line leading-out structures 70, and the fourth gate line leading-out structures 80 and the shield leading-out structure 90 are led out at the back side towards the direction away from the capacitive structure 91 in the third direction Z.

In some implementations, the first gate line leading-out structure 50 and the second gate line leading-out structure 60 are located at an end of the first gate structure 10 away from the capacitive structure 91 in the third direction Z, the third gate line leading-out structure 70 and the fourth gate line leading-out structure 80 are located at an end of the second gate structure 20 away from the capacitive structure 91 in the third direction Z, and the shield leading-out structure 90 is located at an end of the shielding structure 40 close to the capacitive structure 91 in the third direction Z.

In an implementation of the present disclosure, the similarities to the above-described implementations include that the first gate line leading-out structure 50 to the fourth gate line leading-out structure 80 are all located on a side away from the capacitive structure 91 (or capacitor array 93) in the third direction Z. However, as shown in FIGS. 20, 21 and 22, the shield leading-out structure 90 is located on a side close to the capacitive structure 91 (or capacitor array 93) in the third direction Z. Assuming that in the semiconductor device 100, the side on which the capacitive structure 91 (or capacitor array 93) is located in the third direction Z is the front side, the first gate line leading-out structure 50 to the fourth gate line leading-out structure 80 are led out at the back side towards the direction away from the capacitive structure 91 in the third direction Z, and the shield leading-out structure 90 are led out at the front side towards the direction close to the capacitive structure 91 in the third direction Z.

In some examples, the first gate line leading-out structure 50 to the fourth gate line leading-out structure 80 may include conductive materials including, but not limited to tungsten (W), cobalt (Co), copper (Cu), aluminum (Al), silicide or any combination thereof. Materials for the first gate line leading-out structure 50 to the fourth gate line leading-out structure 80 may be the same or different. In the present disclosure, connections to the gate lines are led out by the first gate line leading-out structure 50 to the fourth gate line leading-out structure 80, which facilitates the process flow and improves reliability.

In some examples, the shield leading-out structure 90 may include conductive materials including, but not limited to tungsten (W), cobalt (Co), copper (Cu), aluminum (Al), silicide or any combination thereof. Materials for the shield leading-out structure 90 and the shielding structure 40 may be the same or different. In the present disclosure, the shield leading-out structure 90 and the shielding structure 40 are electrically interconnected and a fixed voltage is applied to the shielding structure 40 via the shield leading-out structure 90. That is, the shield leading-out structure 90 may be connected with the common end to allow the shielding structure 40 to perform a shielding function.

Figure 26:
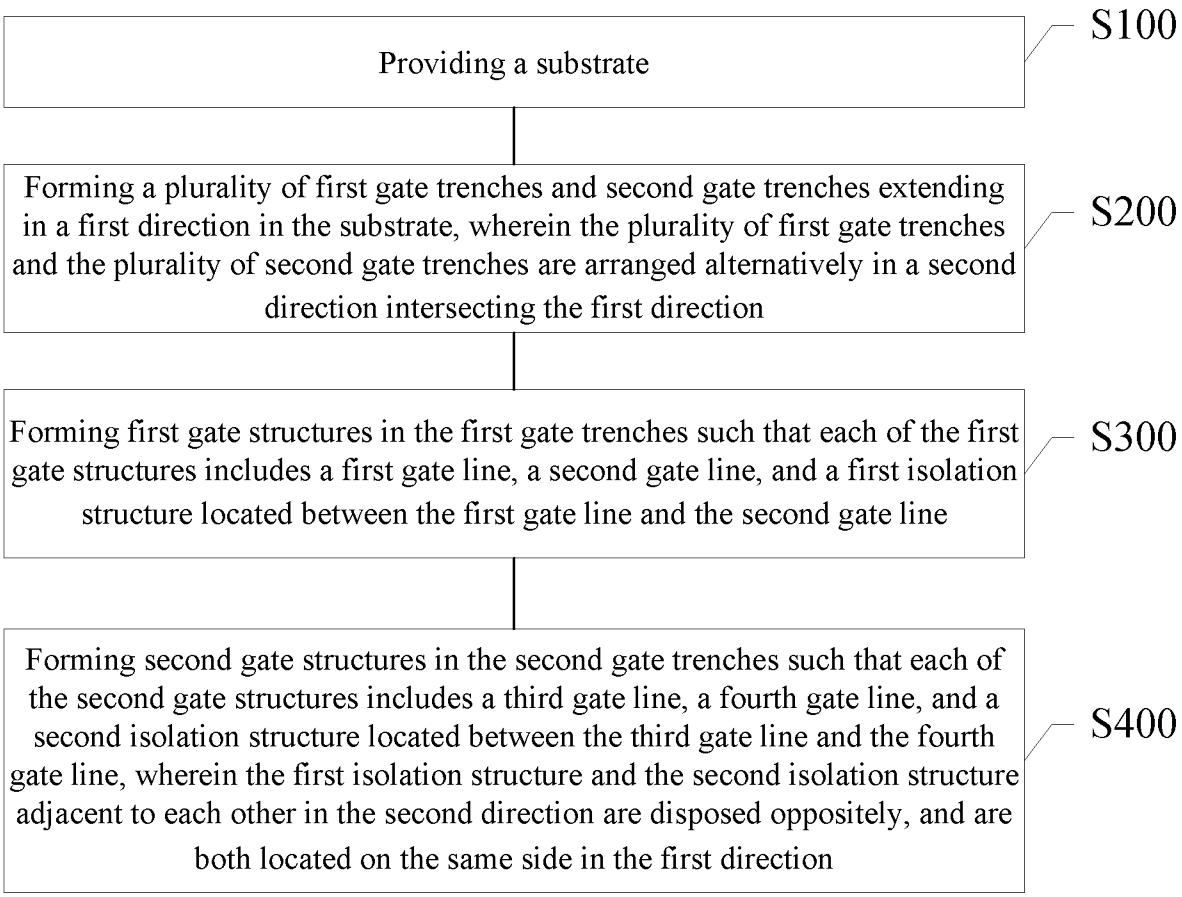
FIG. 26 is a flowchart of a method of fabricating a semiconductor device as provided by an implementation of the present disclosure.

Implementations of the present disclosure further provide a fabrication method of a semiconductor device 100. The semiconductor device 100 in the above-described implementations may be fabricated by the fabrication method of the semiconductor device 100 as described below. FIG. 26 is a schematic flowchart of a fabrication method of a semiconductor device 100 in an implementation of the present disclosure. As shown in FIG. 26, the method includes S100 of providing a substrate 1.

In some examples, the substrate 1 is a material for fabricating the semiconductor device 100. The substrate 1 may include silicon (e.g., single crystalline silicon, polysilicon), silicon germanium (SiGe), silicon carbide (SiC), gallium nitride (GaN), indium phosphate (InP), gallium arsenide (GaAs), germanium (Ge), silicon-on-insulator (SOI), germanium-on-insulator (GOI) or any suitable combination thereof. The substrate 1 may include a wafer formed by grinding, polishing, and slicing of a cylinder of single crystalline silicon.

The method further includes S200, in which as shown in FIGS. 9 and 10, a plurality of first gate trenches K2 and second gate trenches K3 extending in a first direction X are formed in the substrate 1, wherein the plurality of first gate trenches K2 and the plurality of second gate trenches K3 are arranged alternatively in a second direction Y intersecting the first direction X.

In some implementations of the present disclosure, a semiconductor pillar array 30 is first formed before forming the first gate trenches K2 and the second gate trenches K3. Refer to the implementation corresponding to FIGS. 2 to 9 below for the example process of forming the semiconductor pillar array 30. After forming the semiconductor pillar array 30, the first gate trenches K2 and the second gate trenches K3 extending in the first direction X are formed in the substrate 1. As shown in FIGS. 9 and 10, the plurality of first gate trenches K2 and the plurality of second gate trenches K3 are arranged alternatively in the second direction Y and the semiconductor pillars 31 are located between adjacent first gate trenches K2 and second gate trenches K3. In implementations of the present disclosure, it is possible to form the first gate trenches K2 extending in the first direction X and the second gate trenches K3 extending in the first direction X simultaneously, thereby simplifying the fabrication process and improving efficiency.

Figure 11:
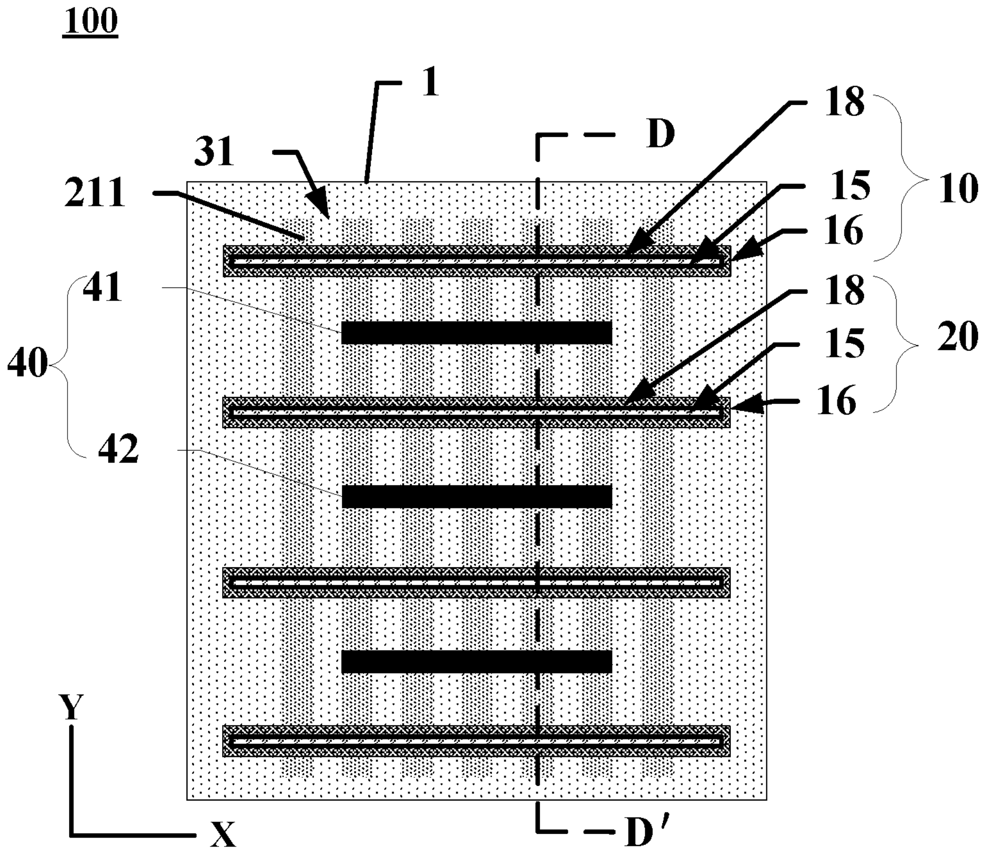
FIG. 11 is a top view of a first gate structure, a second gate structure and a shielding structure as provided in an implementation of the present disclosure.
Figure 12:
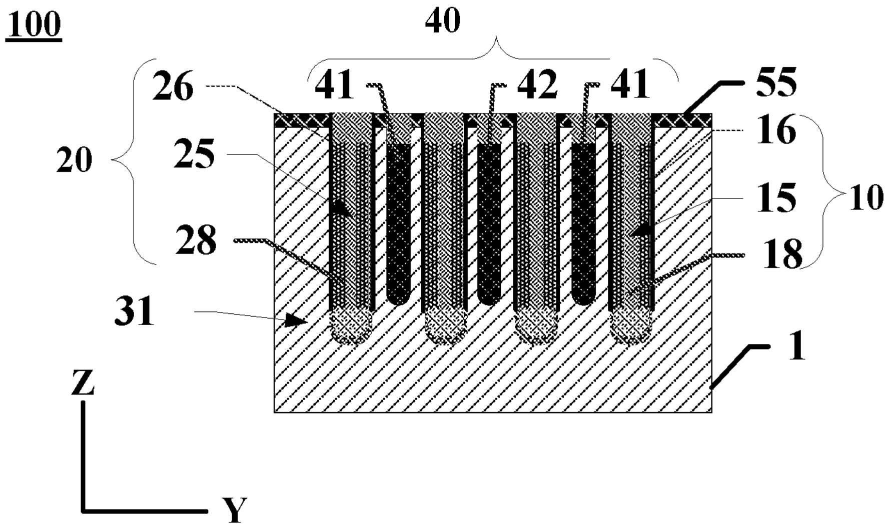
FIG. 12 is a sectional structure diagram along the D-D' cut-line in FIG. 9 as provided in an implementation of the present disclosure.

The method further includes S300, in which as shown in FIGS. 11 to 12, first gate structures 10 are formed in the first gate trenches K2 such that each of the first gate structures 10 includes a first gate line 11, a second gate line 12, and a first isolation structure 13 located between the first gate line 11 and the second gate line 12.

In some implementations, the forming the first gate structures 10 further includes: at S310, forming a first oxide layer 16 on the inner wall of the formed first gate trench K2; at S320, forming a first conductive layer 18 on the inner wall of the first oxide layer 16; at S330, forming a first spacer structure 15 in the first conductive layer 18; and at S340, forming the first isolation structure 13 at a first side of the first end of the first conductive layer 18 and forming the third isolation structure 14 at a second side of the second end of the first conductive layer 18, so that the formed first conductive layer 18 is separated into the first gate line 11 and second gate line 12. Here, the first end and the second end are two opposite ends of the first conductive layer 18 in the first direction X, and the first side and the second side are two opposite sides of the first conductive layer 18 in the second direction Y.

In some implementations, as shown in FIGS. 9 and 10, after forming the first gate trenches K2 and the second gate trenches K3, as shown in FIGS. 11 and 12, it is possible to deposit a sacrificial material in the first gate trenches K2 and remove partial sacrificial material filled in the second gate trenches K3 with a mask, and then deposit a metal material to form the shielding structures 40. It is possible to deposit a sacrificial material in the second gate trenches K3, remove partial sacrificial material filled in the first gate trenches K2 with a mask, then form first oxide layers 16 along the inner walls of the first gate trenches K2, and deposit a metal material on sidewalls of the first oxide layers 16 to form the first conductive layers 18.

After forming the first gate trenches K2, as shown in FIGS. 11 and 12, it is possible to form the first oxide layers 16 on sidewalls of the gate trenches K2. The first oxide layers 16 may comprise silicon oxide layers formed with a rapid thermal oxidation (RTO) or in-situ stream generation (ISSG). As shown in FIGS. 11 and 12, the exposed sidewalls of semiconductor pillars 31 are oxidized via the gate trenches K2, thereby forming the first oxide layers 16 on sidewalls of the semiconductor pillars 31, namely the sidewalls of the gate trenches K2. Processes for oxidizing sidewalls of the semiconductor pillars 31 exposed in the gate trenches K2 include, but not limited to a direct oxidation, basic oxidation, or acidic oxidation.

In some implementations of the present disclosure, the direct oxidation by heating allows silicon on sidewalls of the semiconductor pillars 31 to react with gases containing oxidizing species under high temperature, thereby generating a layer of dense silicon dioxide film on the silicon surface, and thus forming the first oxide layers 16 on sidewalls of the semiconductor pillars 31. The first oxide layer 16 includes insulating materials such as silicon oxide, silicon oxynitride, etc.

Figure 13:
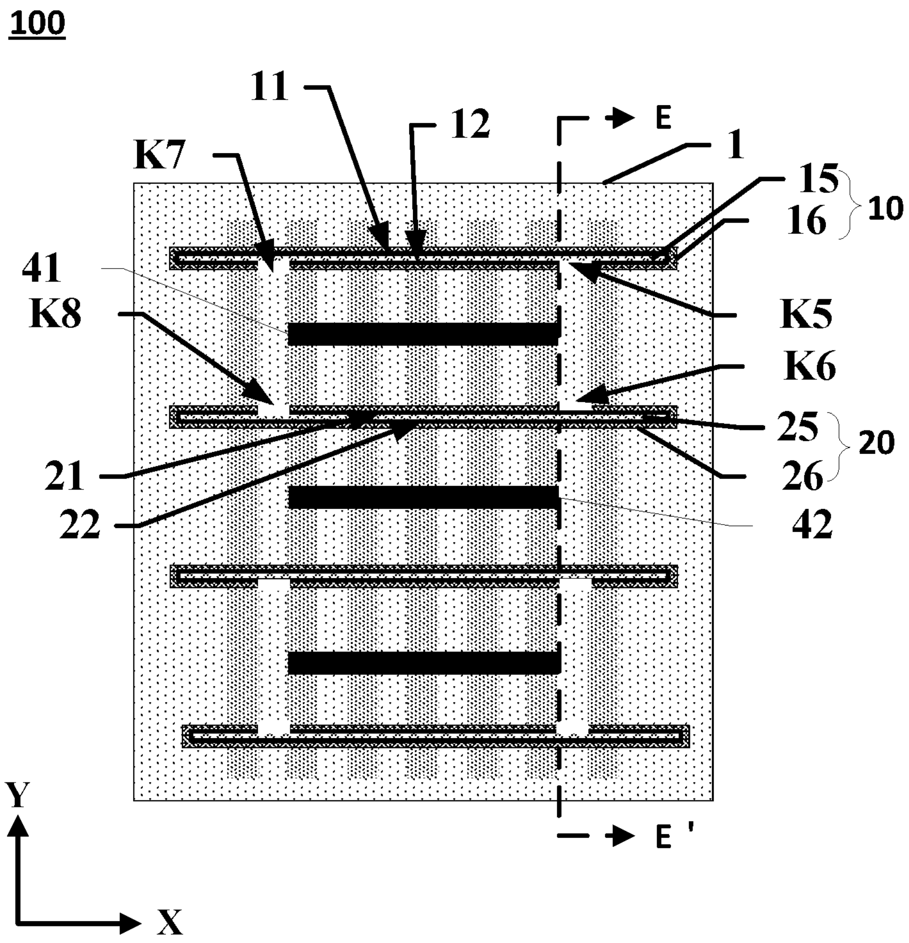
FIG. 13 is a top view of first to fourth trenches as provided in an implementation of the present disclosure.
Figure 14:
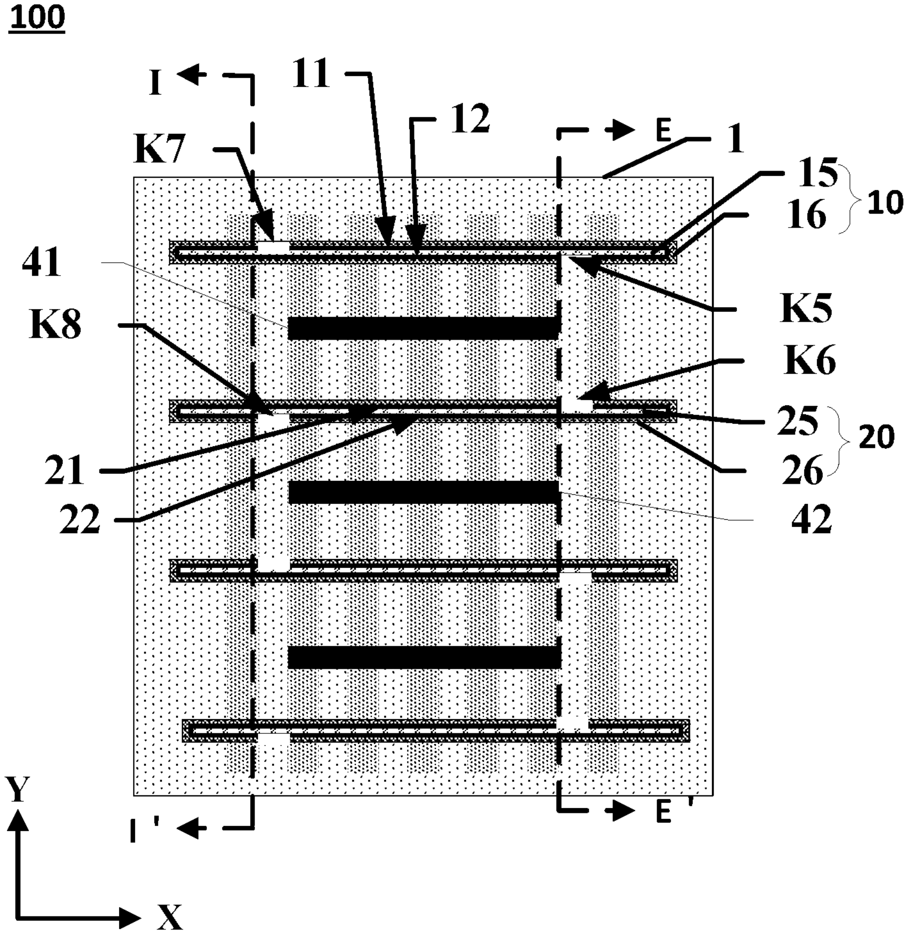
FIG. 14 is a top view of another first to fourth trenches as provided in an implementation of the present disclosure.
Figure 15:
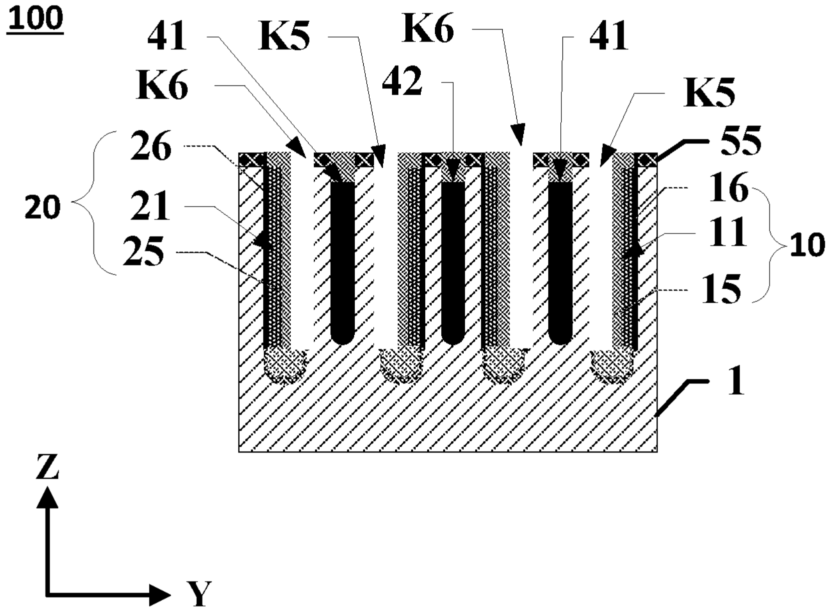
FIG. 15 is a sectional structure diagram along the E-E' cut-line in FIG. 13 or 14 as provided in an implementation of the present disclosure.

After forming the first oxide layer 16, a first conductive layer 18 is formed on the sidewall of the first oxide layer 16. In some examples, the first conductive layer 18 is deposited on the sidewall of the first oxide layer 16, and the first spacer structure 15 is formed in the first conductive layer 18 to obtain the first gate structure 10 as shown in FIGS. 11 and 12. After forming the first gate structure 10, partial first oxide layer 16 and partial first spacer structure 15 on the first side of the first gate structure 10 in the first direction X are removed in the third direction Z, as shown in FIGS. 13 and 15, or as shown in FIGS. 14 and 15, or as shown in FIGS. 14 and 16, so that a first trench K5 is formed on the first side of the first gate structure 10 in the first direction X. Then, a first isolation structure 13 is formed in the first trench K5.

The first conductive layer 18 includes, but is not limited to conductive materials such as tungsten (W), cobalt (Co), copper (Cu), aluminum (Al), silicide or any combination thereof. The first spacer structure 15 may include, but not limited to: any one or combination of insulating materials such as silicon oxide, silicon nitride, silicon oxynitride, aluminum oxide, polysilicone or polysilizane, etc.

In some implementations, the deposition method of the conductive materials may include, but not limited to chemical vapor deposition (CVD), physical vapor deposition (PVD), plasma-enhanced CVD (PECVD), sputtering, metal-organic chemical vapor deposition (MOCVD), atomic layer deposition (ALD), etc.

The method further includes S400, in which second gate structures 20 are formed in the second gate trenches K3 such that each of the second gate structures 20 includes a third gate line 21, a fourth gate line 22, and a second isolation structure 23 located between the third gate line 21 and the fourth gate line 22, wherein the first isolation structure 13 and the second isolation structure 23 adjacent to each other in the second direction Y are disposed oppositely, and are both located on the same side in the first direction.

In some implementations, the forming the second gate structures 20 further includes: at S410, forming a second oxide layer 26 on the inner wall of the formed second gate trench K3; at S420, forming a second conductive layer 28 on the inner wall of the second oxide layer 26; at S430, forming a second spacer structure 25 in the second conductive layer 28; and at S440, forming the second isolation structure 23 at a first side of the first end of the second conductive layer 28 and forming the fourth isolation structure 24 at a second side of the second end of the second conductive layer 28, so that the formed second conductive layer 28 is separated into the third gate line 21 and fourth gate line 22, wherein the first end and the second end are two opposite ends of the second conductive layer 28 in the first direction X, and the first side and the second side are two opposite sides of the second conductive layer 28 in the second direction Y.

In an implementation, the forming the second gate structure 20 shown in FIGS. 9 to 12 may be referred to for the flow of forming the second gate structure 20 in the implementation of the present disclosure. After forming the second gate structure 20, partial second oxide layer 26 and partial second spacer structure 25 on the first side of the second gate structure 20 in the first direction X are removed in the third direction Z, as shown in FIGS. 13 and 15, or as shown in FIGS. 14 and 15, or as shown in FIGS. 14 and 16, so that a second trench K6 is formed on the first side of the second gate structure 20 in the first direction X. Then, a second isolation structure 23 is formed in the second trench K6.

In some implementations, the method further includes: allowing the first gate structure 10 to further include a third isolation structure 14 located between the first gate line 11 and the second gate line 12 and on the other side in the first direction X; and allowing the second gate structure 20 to further include a fourth isolation structure 24 located between the third gate line 21 and the fourth gate line 22 and on the other side in the first direction X, where the third isolation structure 14 and the fourth isolation structure 24 adjacent to each other in the second direction Y are disposed oppositely.

In the implementation of the present disclosure, after forming the first gate structure 10, partial first oxide layer 16 and partial first spacer structure 15 on the second side of the first gate structure 10 in the first direction X are removed in the third direction Z, as shown in FIGS. 13 and 15, or as shown in FIGS. 14 and 15, or as shown in FIGS. 14 and 16, so that a third trench K7 is formed on the second side of the first gate structure 10 in the first direction X. Then, a third isolation structure 14 is formed in the third trench K7, and the first gate structure 10 is separated by the first isolation structure 13 and the third isolation structure 14 into the first gate line 11 and the second gate line 12. Likewise, after forming the second gate structure 20, partial second oxide layer 26 and partial second spacer structure 25 on the second side of the second gate structure 20 in the first direction X are removed in the third direction Z, as shown in FIGS. 13 and 15, or as shown in FIGS. 14 and 15, or as shown in FIGS. 14 and 16, so that a fourth trench K8 is formed on the second side of the second gate structure 20 in the first direction X. Then, a fourth isolation structure 24 is formed in the fourth trench K8, and the second gate structure 20 is separated by the second isolation structure 23 and the fourth isolation structure 24 into the third gate line 21 and the fourth gate line 22.

As shown in FIGS. 13 and 15, the first trench K5 and the third trench K7 are located on the first side and second side of the first gate structure 10 in the first direction X respectively, and the first trench K5 and the third trench K7 are located on the same side of the first gate structure 10 in the second direction Y. Likewise, the second trench K6 and the fourth trench K8 are located on the first side and second side of the second gate structure 20 in the first direction X respectively, and the second trench K6 and the fourth trench K8 are located on the same side of the second gate structure 20 in the second direction Y.

In some implementations, it is possible to form corresponding first groove, second groove, third groove and fourth groove by dry etching according to locations corresponding to the openings on the mask, then increase the size of the first groove to form the first trench K5 by wet etching, and similarly increase the size of the second groove to form the second trench K6 by wet etching, increase the size of the third groove to form the third trench K7 by wet etching, and increase the size of the fourth groove to form the fourth trench K8 by wet etching.

In some implementations, the method further includes: disposing the first isolation structure 13 and the third isolation structure 14 of the same first gate structure 10 on different sides in the second direction Y; and disposing the second isolation structure 23 and the fourth isolation structure 24 of the same second gate structure 20 on different sides in the second direction Y.

In the implementation of the present disclosure, after forming the first gate structure 10, the first trenches K5 to the fourth trenches K8 are formed according to the above-described implementations. As shown in FIGS. 14, 15, and 16, the first trench K5 and the third trench K7 are located on the first side and second side of the first gate structure 10 in the first direction X respectively, and the first trench K5 and the third trench K7 are located on different sides of the first gate structure 10 in the second direction Y. Likewise, the second trench K6 and the fourth trench K8 are located on the first side and second side of the second gate structure 20 in the first direction X respectively, and the second trench K6 and the fourth trench K8 are located on the same side of the second gate structure 20 in the second direction Y. Then, the first isolation structure 13 is formed in the first trenches K5, the second isolation structure 23 is formed in the second trenches K6, the third isolation structure 14 is formed in the third trenches K7, and the fourth isolation structure 24 is formed in the fourth trenches K8.

In some implementations, the fabrication method further includes: forming a plurality of shielding trenches K4 extending in the first direction X in the substrate 1, each of which is located between adjacent first gate trench K2 and second gate trench K3 in the second direction Y; and forming shielding structures 40 in the shielding trenches K4.

In the implementation of the present disclosure, after forming the semiconductor pillar array 30, shielding trenches K4 extending in the first direction X are further formed in the substrate 1. The plurality of shielding trenches K4 are arranged with intervals in the second direction Y, and each shielding trench K4 is located between the first gate structures 10 and the second gate structures 20 adjacent to each other in the second direction Y. That is, in the second direction Y, the first gate structures 10 and the second gate structures 20 are disposed alternatively and a shielding trench K4 is disposed between the first gate structure 10 and second gate structure 20 adjacent to each other in the second direction Y. Then, a conductive material is filled in the shielding trenches K4 to form shielding structures 40. The above-described implementations may be referred to for materials included in the conductive materials, which will not be described in detail herein.

In some implementations, forming the shielding trenches K4 includes: forming the shielding trenches K4 to have the size in the first direction X smaller than the size of the first gate trench K2 in the first direction X.

In the implementation of the present disclosure, the size of the shielding trench K4 in the first direction X may be smaller than the size of the first gate trench K2 (or the second gate trench K3) in the first direction X. Thus, it is possible to reduce the material consumption for forming the shielding structures 40 and further reduce the fabrication cost. Since less conductive material is used to form the shielding structures 40, the time for fabricating the semiconductor device 100 in implementations of the present disclosure is reduced, which also improves the production efficiency of the semiconductor device 100.

Figure 8:
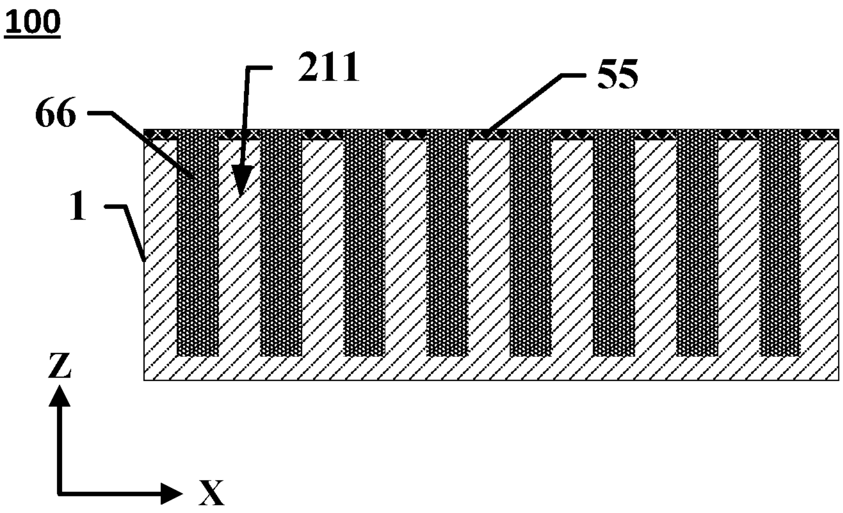
FIG. 8 is a sectional structure diagram along the B-B' cut-line in FIG. 7 as provided in an implementation of the present disclosure.

In some implementations, a dry etching process or wet etching process may be used to etch the substrate 1. In case that the substrate 1 is etched with the dry etching process, it is possible to control the extension sizes of the first gate trenches K2, the second gate trenches K3 and the shielding trenches K4 in the third direction Z by controlling the duration of the dry etching. As shown in FIG. 8, the first etch depth H1 of the first gate trenches K2 (namely the extension size in the third direction Z) may be equal to the second etch depth H2 of the second gate trenches K3 (namely the extension size in the third direction Z). The third etch depth H3 of the shielding trenches K4 (namely the extension size in the third direction Z) is smaller than the first etch depth H1 of the first gate trenches K2 (or the second etch depth H2 of the second gate trenches K3).

In some implementations, the etch depth may be controlled by process parameters of etching (for example, an etching duration, gas flow rate, ratio, pressure, temperature, etc.). For example, given a constant etching rate, the longer the etching duration is, the deeper the formed trench is in the third direction Z. In an implementation of the present disclosure, it is possible to make the first etch depth H1 of the first gate trenches K2 greater than the third etch depth H3 of the shielding trenches K4 by adjusting process parameters of the etching. The etching method may be dry etching such as a plasma etching.

In some implementations, it is possible to set etch widths (namely extension sizes in the second direction Y) of the first gate trenches K2, the second gate trenches K3 and the shielding trenches K4 by the mask. For example, the mask includes first openings corresponding to the first gate trenches K2, second openings corresponding to the second gate trenches K3, and third openings corresponding to the shielding trenches K4. Sizes of the first opening and second opening in the second direction Y may be the same. The size of the first opening in the second direction Y may be greater than the size of the second opening in the second direction Y.

In some implementations, the shielding structure 40 between the first gate structure 10 and the second gate structure 20 adjacent to each other may have the same or approximately same spacing from the adjacent first gate structure 10 and second gate structure 20.

In some implementations, the method further includes: forming a first gate line leading-out structure 50 and a second gate line leading-out structure 60, connecting the first gate line leading-out structure 50 with the first gate line 11 at the first end of the first gate structure 10 in the first direction X, and connecting the second gate line leading-out structure 60 with the second gate line 12 at the second end of the first gate structure 10 in the first direction X; forming a third gate line leading-out structure 70 and a fourth gate line leading-out structure 80, connecting the third gate line leading-out structure 70 with the third gate line 21 at the first end of the second gate structure 20 in the first direction X, and connecting the fourth gate line leading-out structure 80 with the fourth gate line 22 at the second end of the second gate structure 20 in the first direction X; and forming a shield leading-out structure 90 and connecting the shield leading-out structure 90 with an end of the shielding structure 40 in the first direction X.

In the implementation of the present disclosure, after forming the first isolation structure 13 to the fourth isolation structure 24 and the shielding structure 40 as shown in FIGS. 18 and 19, a part of the shielding structure 40 is removed to form a shield leading-out structure 90 connected with an end of the shielding structure 40 in the first direction X, a part of a spacer structure in the first gate structure 10 close to the side of the first gate line 11 is removed to form a first gate line leading-out structure 50 connected with the first end of the first gate line 11 in the first direction X, a part of a spacer structure in the first gate structure 10 close to the side of the second gate line 12 is removed to form a second gate line leading-out structure 60 connected with the second end of the second gate line 12 in the first direction X, a part of a spacer structure in the second gate structure 20 close to the side of the third gate line 21 is removed to form a third gate line leading-out structure 70 connected with the first end of the third gate line 21 in the first direction X, and a part of a spacer structure in the second gate structure 20 close to the side of the fourth gate line 22 is removed to form a fourth gate line leading-out structure 80 connected with the second end of the fourth gate line 22 in the first direction X, as shown in FIGS. 20 to 24. The above-described implementations may be referred to for materials of the gate leading-out contact 32, which will not be described in detail herein.

In some implementations, the plurality of shielding structures 40 include odd-numbered rows of shielding structures 41 and even-numbered rows of shielding structures 42 arranged alternatively in the second direction Y. And, forming the shield leading-out structures 90 further includes: connecting the plurality of shield leading-out structures 90 with the first ends of the odd-numbered rows of shielding structures 41 and the second ends of the even-numbered rows of shielding structures 42 respectively. The first end and the second end here are two opposite ends of an individual shielding structure 40 in the first direction X.

In some implementations, forming the shield leading-out structures 90 further includes: forming the shield leading-out structure 90 between the first isolation structure 13 and the second isolation structure 23 adjacent to each other or between the third isolation structure 14 and the fourth isolation structure 24 adjacent to each other.

In some implementations, the fabrication method further includes: forming separating structures 211 extending in the second direction Y and arranged with intervals in the first direction X on the substrate 1 such that a semiconductor pillar array 30 is formed in the substrate 1 after forming the first gate trenches K2 and the second gate trenches K3, where the semiconductor pillar array 30 includes semiconductor pillars 31 extending in the third direction Z and the third direction Z intersects the first direction X and the second direction Y; forming a capacitive structure 91 located on a side of the semiconductor pillar 31 in the third direction Z and connecting the capacitive structures 91 with the semiconductor pillar 31 and a common end, wherein the capacitive structure 91 extends in the third direction Z; and forming a bit line 92 located on the other side of the semiconductor pillar 31 in the third direction Z and extending in the first direction X and connected with the semiconductor pillar 31.

Figure 3:
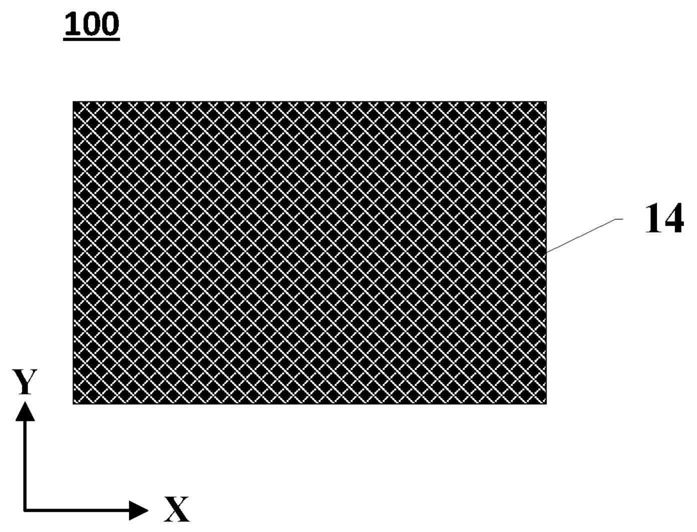
FIG. 3 is a top view of a substrate as provided in an implementation of the present disclosure.
Figure 4:
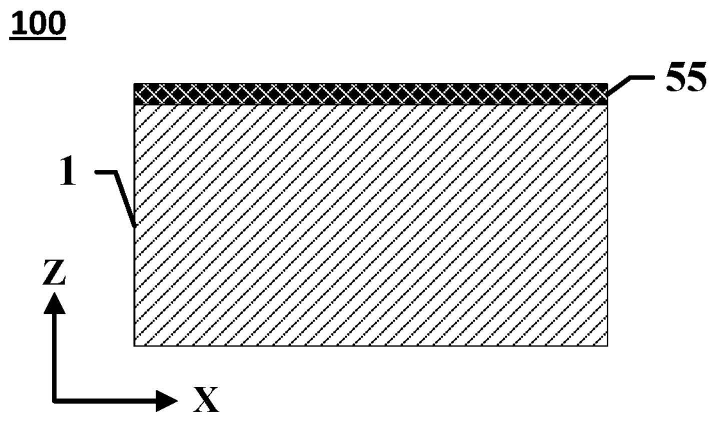
FIG. 4 is a sectional structure diagram of a substrate as provided in an implementation of the present disclosure.
Figure 5:
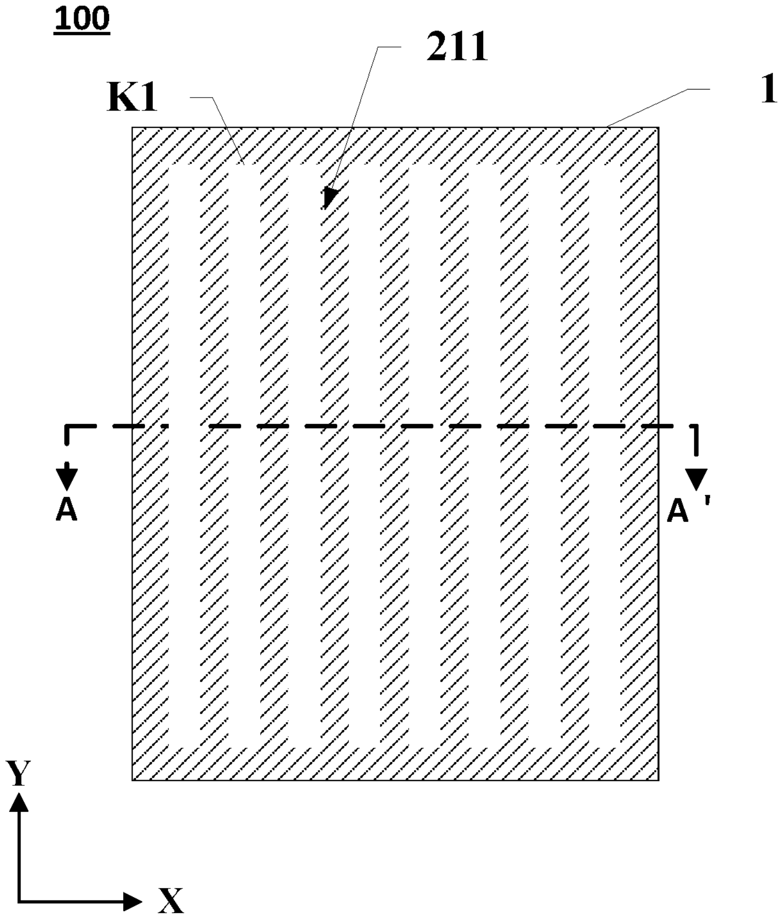
FIG. 5 is a top view of forming an isolation trench as provided in an implementation of the present disclosure.
Figure 6:
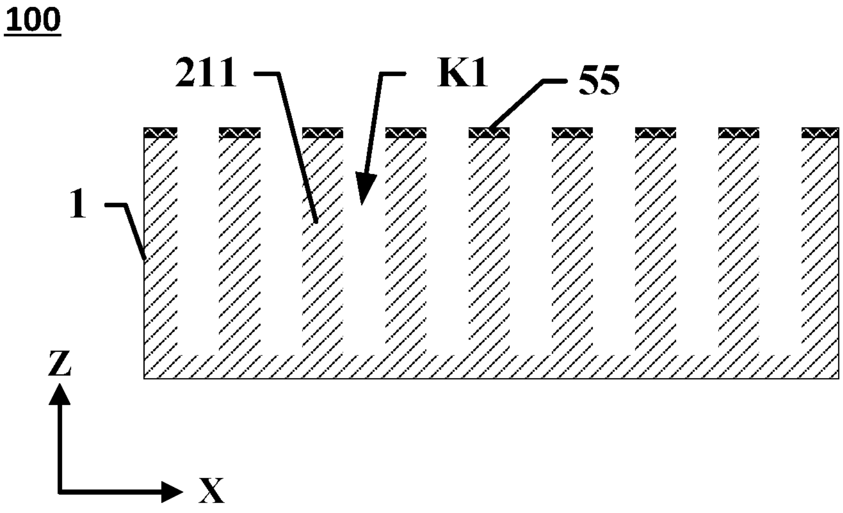
FIG. 6 is a sectional structure diagram of the formed isolation trench along the A-A' cut-line in FIG. 5 as provided in an implementation of the present disclosure.
Figure 7:
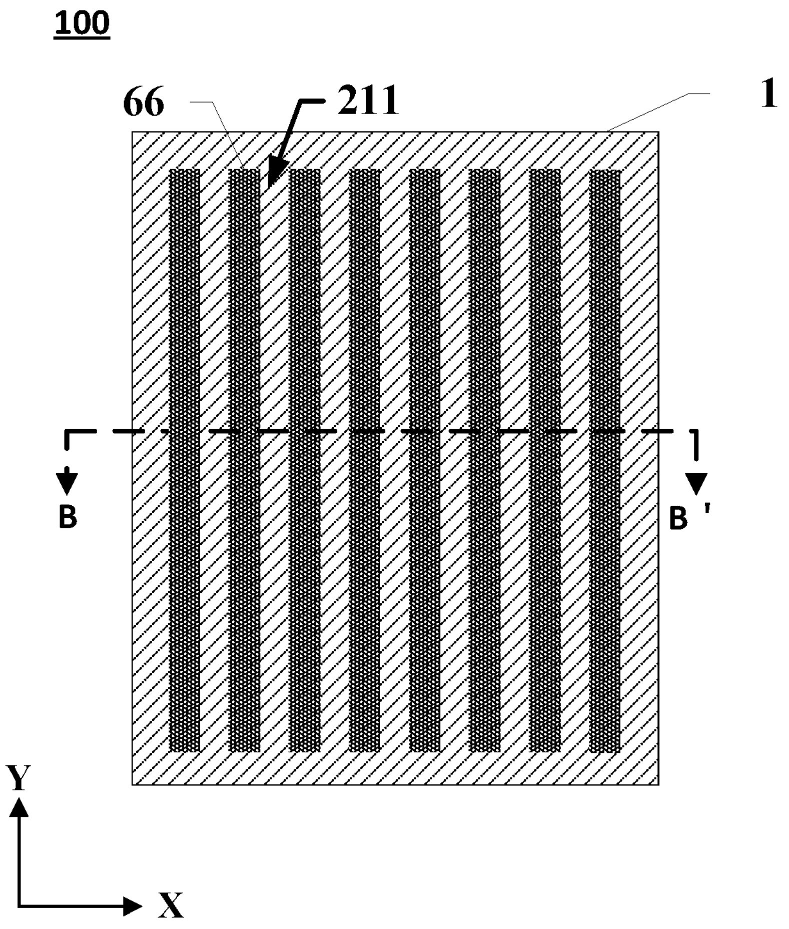
FIG. 7 is a top view of depositing a dielectric material in an isolation trench as provided in an implementation of the present disclosure.

In an implementation, as shown in FIGS. 2 to 9, forming the semiconductor pillar array 30 includes forming the separating structures 211 after forming the isolation trenches K1, and forming a plurality of semiconductor pillars 31 arranged in an array in the first direction X and the second direction Y after forming the first gate trenches K2 and the second gate trenches K3 in the substrate 1. As shown in FIGS. 3 and 4, a first dielectric layer 55 covering the substrate 1 is first formed by deposition in the third direction Z to protect the surface of the substrate 1, thereby forming a structure in which the substrate 1 and the first dielectric layer 55 are stacked sequentially in the third direction Z as shown in FIGS. 3 and 4. The first dielectric layer 55 may include any one or more of silicon oxide, silicon nitride, aluminum oxide or silicon oxynitride. As shown in FIGS. 5 and 6, a plurality of isolation trenches K1 extending in the third direction Z and arranged with intervals in the first direction X are formed in the substrate 1. As shown in FIGS. 7 and 8, a dielectric material 66 is filled on the inner walls of the isolation trenches K1.

In some examples, it is possible to form a plurality of isolation trenches K1 in the substrate 1, and as shown in FIGS. 5 and 6, it is also possible to form a plurality of isolation trenches K1 in the structure as shown in FIGS. 3 and 4. As shown in FIGS. 5 and 6, the plurality of isolation trenches K1 extend in the second direction Y and are arranged with intervals in the first direction X. The isolation trenches K1 extend in the third direction Z but do not penetrate through the substrate 1.

Forming the isolation trenches K1 includes: etching from the surface of the first dielectric layer 55 as shown in FIG. 4 to form isolation trenches K1 extending in the third direction Z and arranged with intervals in the first direction X, wherein the isolation trenches K1 may extend in the third direction Z to the substrate 1 but do not penetrate through the substrate 1. As shown in FIGS. 5 and 6, during the etching process, it is possible to cover a part of the surface of the substrate 1 or the first dielectric layer 55 with a mask (not shown), in which isolation trenches K1 are to be formed. Then, the substrate 1 is etched from the surface of the substrate 1 in the thickness direction (e.g., the third direction Z) of the substrate 1. Parts of both the substrate 1 and the first dielectric layer 55 that are outside of the regions covered by the mask are etched away to form grooves with a certain depth, namely the above-described isolation trenches K1. It is to be noted that the isolation trenches K1 are formed to have the etch depth smaller than the initial thickness of the substrate 1. That is, the etching process will not etch through the substrate 1.

In some examples, it is possible to use photolithography (PH), dry etching (ET), or the like for etching, such as electron beam photolithography process, plasma etching process or reactive ion etching process, which is not limited in some implementations of the present disclosure.

In some implementations of the present disclosure, a plurality of isolation trenches K1 with the same depth are simultaneously formed by etching the entire surface of the substrate 1, which can simplify the fabrication process and improve efficiency.

In some examples, FIG. 7 is a top view of depositing a dielectric material 66 in isolation trenches K1 as provided in some implementations of the present disclosure, and FIG. 8 is a sectional structure diagram of depositing a dielectric material 66 in isolation trenches K1 as provided in some implementations of the present disclosure. After forming the isolation trenches K1 as shown in FIGS. 5 and 6, a dielectric material 66 is deposited in isolation trenches K1 with a deposition process, as shown in FIGS. 7 and 8.

In some implementations, the dielectric material 66 includes, but not limited to, any one of silicon nitride, silicon oxide or silicon oxynitride or any combination thereof. Here, the silicon oxide refers to a compound of silicon and oxygen, such as $Si_xO_y$, and the silicon nitride refers to a compound of silicon and nitrogen, such as $Si_xN_y$.

Since isolation trenches K1 are formed as shown in FIGS. 5 and 6 and the plurality of isolation trenches K1 are arranged with intervals in the first direction X, there are separating structures 211 located between isolation trenches K1 formed by removing partial semiconductor material from the substrate 1 and for separating two adjacent isolation trenches K1. FIG. 9 is a top view of etching and forming the first gate trenches K2, the second gate trenches K3 and the shielding trenches K4 as provided in some implementations of the present disclosure, and FIG. 10 is a sectional structure diagram of etching and forming the first gate trenches K2, the second gate trenches K3 and the shielding trenches K4 as provided in some implementations of the present disclosure. As shown in FIGS. 9 and 10, a part of dielectric material 66 filled between separating structures 211 in the substrate 1 is removed to form the first gate trenches K2, the second gate trenches K3 and the shielding trenches K4. A plurality of first gate trenches K2, second gate trenches K3 and shielding trenches K4 arranged with intervals in the second direction Y expose adjacent separating structures 211, thereby forming the semiconductor pillars 31 arranged in an array and located between the first gate trenches K2 and the shielding trenches K4 as well as between the second gate trenches K3 and the shielding trenches K4 as shown in FIG. 9 in the second direction Y.

It is to be noted that in a practical process of depositing the dielectric material 66, the dielectric material 66 will cover the surface of the separating structures 211. As shown in FIG. 7, the dielectric material 66 is filled around each separating structure 211. In addition, after the deposition is completed, it is possible to remove excess dielectric material 66 for planarization by a chemical mechanical polishing (CMP) process.

In some implementations of the present disclosure, the deposition method of the dielectric material 66 and the first dielectric layer 55 may include, but not limited to, chemical vapor deposition (CVD), physical vapor deposition (PVD), plasma-enhanced CVD (PECVD), sputtering, metal-organic chemical vapor deposition (MOCVD), atomic layer deposition (ALD), etc.

Figure 23:
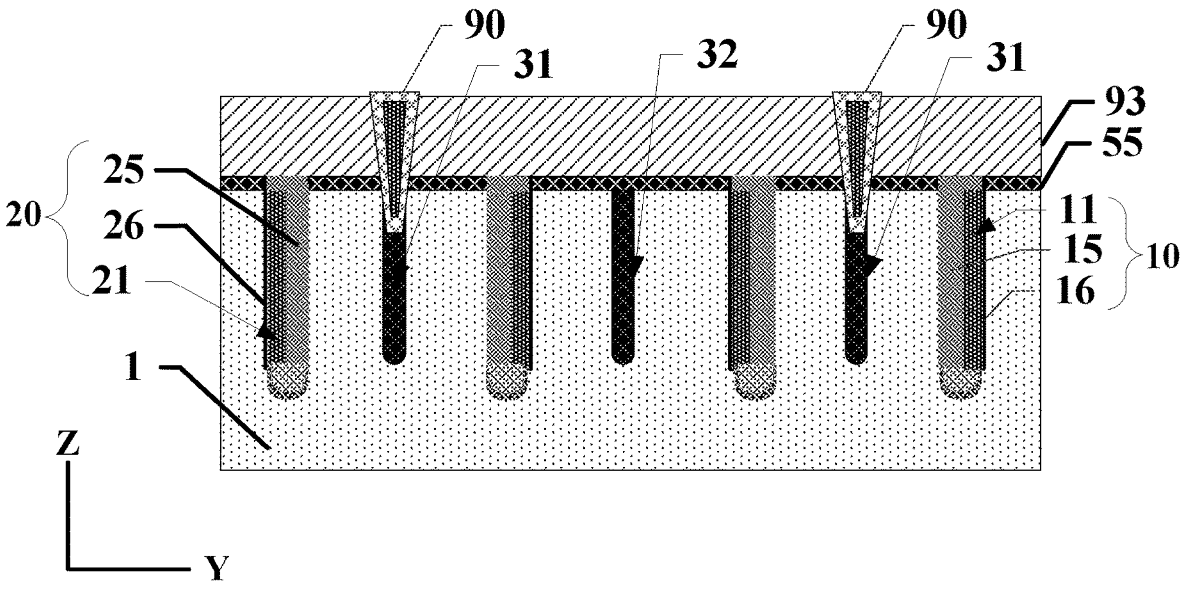
FIG. 23 is another sectional structure diagram along the J-J' cut-line in FIG. 20 or 21 as provided in an implementation of the present disclosure.

Forming the capacitive structures 91 includes forming the capacitor array 93 on an end of the semiconductor pillar array 30 in the third direction Z as shown in FIGS. 22 and 23 such that the capacitor array 93 includes a plurality of capacitive structures 91 arranged in an array in the first direction X and the second direction Y and extending in the third direction Z. Each capacitive structure 91 includes a first electrode layer (not shown) connected with a side of the semiconductor pillar 31 in the third direction Z, a second electrode layer (not shown) and a capacitor dielectric layer (not shown) in the first electrode layer, wherein the second electrode layer is connected with the common end. Drains of semiconductor pillars 31 in the same row (namely semiconductor pillars 31 arranged with intervals in the first direction X) are connected to form a bit line 92 (BL).

In some implementations, the method further includes: forming the first gate line leading-out structure 50 and the second gate line leading-out structure 60 at an end of the first gate structure 10 away from the capacitive structure 91 in the third direction Z respectively, forming the third gate line leading-out structure 70 and the fourth gate line leading-out structure 80 at an end of the second gate structure 20 away from the capacitive structure 91 in the third direction Z respectively, and forming the shield leading-out structure 90 at an end of the shielding structure 40 away from the capacitive structure 91 in the third direction Z. The above-described implementations may be referred to for specific contents of the implementation of the present disclosure, which will not be described in detail herein.

In some implementations, forming the first gate line leading-out structures 50, forming the third gate line leading-out structures 70 and forming the shield leading-out structures 90 further includes: forming the first gate line leading-out structure 50 and the second gate line leading-out structure 60 at an end of the first gate structure 10 away from the capacitive structure 91 in the third direction Z respectively, forming the third gate line leading-out structure 70 and the fourth gate line leading-out structure 80 at an end of the second gate structure 20 away from the capacitive structure 91 in the third direction Z respectively, and forming the shield leading-out structure 90 at an end of the shielding structure 40 close to the capacitive structure 91 in the third direction Z. The above-described implementations may be referred to for specific contents of the implementation of the present disclosure, which will not be described in detail herein.

Figure 27:
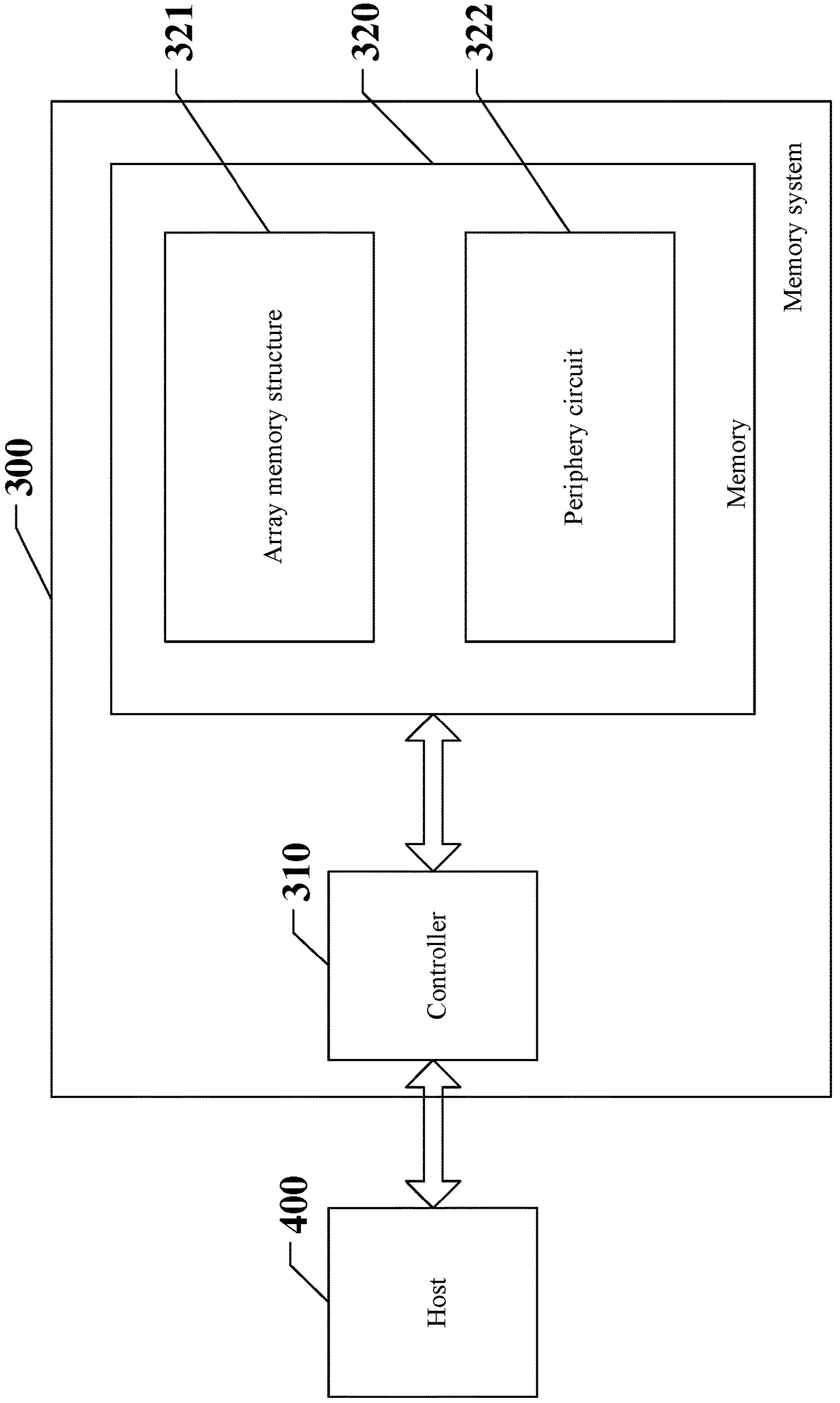
FIG. 27 is a schematic structure diagram of a memory system provided in an implementation of the present disclosure.

Based on the above-described semiconductor device 100 and the fabrication method thereof, an implementation of the present disclosure further provides a memory 320 including: an array memory structure 321 including a semiconductor device 100 as shown in FIGS. 3 to 26; and a periphery circuit 322 connected with the array memory structure 321 to control the bias voltage of the array memory structure 321, as shown in FIG. 27.

Based on the above-described semiconductor device 100 and the fabrication method thereof, an implementation of the present disclosure further provides a memory system 300 including a memory 320 as shown in FIG. 27 and a controller coupled with the memory 320 and configured to control the memory to execute data writing and reading operations, as shown in FIG. 27.

In an implementation, as shown in FIG. 27, the memory system 300 includes a controller 310 and one or more memories 320, wherein the memory 320 (such as a 3D NAND Flash) includes an array memory structure 321 and a periphery circuit 322, and wherein the array memory structure 321 includes a semiconductor device 100 of any one of the above-described implementations. The memory system 300 may communicate with a host 400 through the controller 310, wherein the controller 310 may be connected to one or more memories 320 through pathways in the one or more memories 320. Each memory 320 may be managed by the controller 310 through the pathway in the memory 320.

In an implementation, the array memory structure 321 is configured to store information, and the periphery circuit 322 may be located above or below, or at the periphery of, the array memory structure 321, and configured to control the corresponding array memory structure 321. Moreover, the semiconductor device 100 may be used in other microelectronic devices, such as, but not limited to, a non-volatile flash (e.g. NOR flash). Furthermore, the semiconductor device 100 in implementations of the present disclosure may be a memory 320 or a part of a periphery memory, which is not limited specifically.

The semiconductor device 100 and the fabrication method thereof, and the memory system 300 as provided in implementations of the present disclosure have been described in detail above. Examples are used herein to set forth the principle and implementations of the present disclosure, and the description of the above implementations is only for assisting in understanding the method and core idea thereof of the present disclosure. Meanwhile, those skilled in the art may make modifications to implementations and application ranges according to the idea of the present disclosure. In summary, the contents of the present specification should not be construed as limiting the present disclosure.

What is claimed is:

1. A method of fabricating a semiconductor device, comprising:

providing a substrate;

forming a plurality of first gate trenches and a plurality of second gate trenches extending in a first direction in the substrate, wherein the plurality of first gate trenches and the plurality of second gate trenches are arranged alternately in a second direction intersecting the first direction;

forming a plurality of shielding trenches extending in the first direction in the substrate, each of the plurality of shielding trenches being located between a corresponding first gate trench and a corresponding second gate trench adjacent to each other in the second direction;

forming first gate structures in the first gate trenches, wherein each of the first gate structures comprises a first gate line, a second gate line, and a first isolation structure located between the first gate line and the second gate line;

forming second gate structures in the second gate trenches, each of the second gate structures comprising a third gate line, a fourth gate line, and a second isolation structure located between the third gate line and the fourth gate line, wherein the first isolation structure and the second isolation structure adjacent to each other in the second direction are disposed oppositely, and are both located on a same side in the first direction; and forming shielding structures in the shielding trenches.

2. The method of claim 1, further comprising:

forming the first gate structure to further comprise a third isolation structure located between the first gate line and the second gate line and on the other side in the first direction; and forming the second gate structure to further comprise a fourth isolation structure located between the third gate line and the fourth gate line and on the other side in the first direction, wherein the third isolation structure and the fourth isolation structure adjacent to each other in the second direction are disposed oppositely.

3. The method of claim 2, further comprising:

disposing the first isolation structure and the third isolation structure of a same first gate structure on different sides in the second direction; and disposing the second isolation structure and the fourth isolation structure of a same second gate structure on different sides in the second direction.

4. The method of claim 3, wherein forming the first gate structure further comprises:

forming a first oxide layer on an inner wall of the first gate trench;

forming a first conductive layer on an inner wall of the first oxide layer;

forming a first spacer structure in the first conductive layer; and forming the first isolation structure on a first side of a first end of the first conductive layer and forming the third isolation structure on a second side of a second end of the first conductive layer, wherein the first conductive layer is separated into the first gate line and the second gate line, the first end and the second end are two opposite ends of the first conductive layer in the first direction, and the first side and the second side are two opposite sides of the first conductive layer in the second direction.

5. The method of claim 1, further comprising:

forming a first gate line leading-out structure and a second gate line leading-out structure, connecting the first gate line leading-out structure with the first gate line at a first end of the first gate structure in the first direction, and connecting the second gate line leading-out structure with the second gate line at a second end of the first gate structure in the first direction;

forming a third gate line leading-out structure and a fourth gate line leading-out structure, connecting the third gate line leading-out structure with the third gate line at a first end of the second gate structure in the first direction, and connecting the fourth gate line leading-out structure with the fourth gate line at a second end of the second gate structure in the first direction; and forming a shield leading-out structure and connecting the shield leading-out structure with an end of the shielding structure in the first direction.

6. The method of claim 5, wherein:

the shielding structures comprise odd-numbered rows of shielding structures and even-numbered rows of shielding structures arranged alternately in the second direction, and forming the shield leading-out structures further comprises:

connecting the shield leading-out structures with first ends of the odd-numbered rows of shielding structures and second ends of the even-numbered rows of shielding structures respectively, wherein the first end and the second end are two opposite ends of an individual shielding structure in the first direction.

7. The method of claim 6, wherein forming the shield leading-out structures further comprises:

forming the shield leading-out structure between the first isolation structure and the second isolation structure adjacent to each other.

8. The method of claim 7, further comprising:

forming separating structures extending in the second direction and arranged with intervals in the first direction in the substrate, wherein a semiconductor pillar array is formed in the substrate after forming the first gate trenches and the second gate trenches, and the semiconductor pillar array comprises semiconductor pillars extending in a third direction intersecting the first direction and the second direction;

forming a capacitive structure located on a side of the semiconductor pillar in the third direction and connecting the capacitive structure with the semiconductor pillar and a common end, wherein the capacitive structure extends in the third direction; and forming a bit line located on the other side of the semiconductor pillar in the third direction, wherein the bit line extends in the first direction, and is connected with the semiconductor pillar.

9. The method of claim 8, further comprising:

forming the first gate line leading-out structure and the second gate line leading-out structure at an end of the first gate structure away from the capacitive structure in the third direction, respectively, and forming the third gate line leading-out structure and the fourth gate line leading-out structure at an end of the second gate structure away from the capacitive structure in the third direction, respectively; and forming the shield leading-out structure at an end of the shielding structure away from the capacitive structure in the third direction, or forming the shield leading-out structure at an end of the shielding structure close to the capacitive structure in the third direction.

10. The method of claim 1, wherein the first isolation structure and the second isolation structure, which are adjacent to each other in the second direction, are disposed to face each other in the second direction.

11. A semiconductor device, comprising:

a transistor array comprising a plurality of first gate structures and a plurality of second gate structures extending in a first direction and arranged alternately in a second direction intersecting the first direction; and a plurality of shielding structures, each extending in the first direction and located between a corresponding first gate structure and a corresponding second gate structure adjacent to each other in the second direction, wherein each of the first gate structures comprises a first gate line, a second gate line, and a first isolation structure located between the first gate line and the second gate line, and each of the second gate structures comprises a third gate line, a fourth gate line, and a second isolation structure located between the third gate line and the fourth gate line; and wherein the first isolation structure and the second isolation structure adjacent to each other in the second direction are disposed oppositely, and are both located on a same side in the first direction.

12. The semiconductor device of claim 11, wherein:

the first gate structure further comprises a third isolation structure located between the first gate line and the second gate line and on the other side in the first direction;

the second gate structure further comprises a fourth isolation structure located between the third gate line and the fourth gate line and on the other side in the first direction; and the third isolation structure and the fourth isolation structure adjacent to each other in the second direction are disposed oppositely.

13. The semiconductor device of claim 12, wherein the first isolation structure and the third isolation structure of a same first gate structure are located on different sides in the second direction, and the second isolation structure and the fourth isolation structure of a same second gate structure are located on different sides in the second direction.

14. The semiconductor device of claim 13, wherein:

the first gate structure further comprises:

a first spacer structure located between the first gate line and the second gate line and extending in the first direction; and a first oxide layer on outer sides of the first gate line and the second gate line, which are away from each other; and the second gate structure further comprises:

a second spacer structure located between the third gate line and the fourth gate line and extending in the first direction; and a second oxide layer on outer sides of the third gate line and the fourth gate line, which are away from each other.

15. The semiconductor device of claim 11, wherein the first isolation structure and the second isolation structure, which are adjacent to each other in the second direction, are disposed to face each other in the second direction.

16. A semiconductor device, comprising:

a transistor array comprising a plurality of first gate structures and a plurality of second gate structures extending in a first direction and arranged alternately in a second direction intersecting the first direction, wherein each of the first gate structures comprises a first gate line, a second gate line, and a first isolation structure located between the first gate line and the second gate line, and each of the second gate structures comprises a third gate line, a fourth gate line, and a second isolation structure located between the third gate line and the fourth gate line;

a first gate line leading-out structure at a first end of the first gate structure in the first direction and connected with the first gate line, and a second gate line leading-out structure at a second end of the first gate structure in the first direction and connected with the second gate line; and a third gate line leading-out structure at a first end of the second gate structure in the first direction and connected with the third gate line, and a fourth gate line leading-out structure at a second end of the second gate structure in the first direction and connected with the fourth gate line, wherein the first isolation structure and the second isolation structure adjacent to each other in the second direction are disposed oppositely, and are both located on a same side in the first direction.

17. The semiconductor device of claim 16, further comprising:

a plurality of shielding structures each extending in the first direction and located between the first gate structure and the second gate structure adjacent to each other in the second direction; and a plurality of shield leading-out structures each connected with an end of the shielding structure in the first direction.

18. The semiconductor device of claim 17, wherein the plurality of shielding structures comprise odd-numbered rows of shielding structures and even-numbered rows of shielding structures arranged alternately in the second direction, and the plurality of shield leading-out structures are connected with first ends of the odd-numbered rows of shielding structures and second ends of the even-numbered rows of shielding structures respectively, wherein the first end and the second end are two opposite ends of an individual shielding structure in the first direction.

19. The semiconductor device of claim 18, wherein the shield leading-out structure is located between the first isolation structure and the second isolation structure adjacent to each other or between a third isolation structure and a fourth isolation structure adjacent to each other.

20. The semiconductor device of claim 17, further comprising:

a semiconductor pillar array comprising a plurality of semiconductor pillars arranged in an array along the first direction and the second direction and extending in a third direction intersecting the first direction and the second direction, wherein each semiconductor pillar is located between the shielding structure and the first gate structure or the second gate structure adjacent to each other;

a capacitive structure located on a side of the semiconductor pillar in the third direction and connected with the semiconductor pillar and a common end, wherein the capacitive structure extends in the third direction; and a bit line located on the other side of the semiconductor pillar in the third direction and extending in the first direction and connected with the semiconductor pillar, wherein the first gate line leading-out structure and the second gate line leading-out structure are located at an end of the first gate structure away from the capacitive structure in the third direction, wherein the third gate line leading-out structure and the fourth gate line leading-out structure are located at an end of the second gate structure away from the capacitive structure in the third direction, and wherein the shield leading-out structure is located at an end of the shielding structure away from the capacitive structure in the third direction, or the shield leading-out structure is located at an end of the shielding structure close to the capacitive structure in the third direction.

* * * * *